(12) United States Patent
Liu et al.

(10) Patent No.: US 7,382,020 B2
(45) Date of Patent: Jun. 3, 2008

(54) SEMICONDUCTOR INTEGRATED CIRCUIT

(75) Inventors: Yongxun Liu, Ibaraki (JP); Toshihiro Sekigawa, Ibaraki (JP); Meishoku Masahara, Ibaraki (JP); Kenichi Ishii, Ibaraki (JP); Eiichi Suzuki, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 359 days.

(21) Appl. No.: 11/067,699

(22) Filed: Mar. 1, 2005

(65) Prior Publication Data

US 2005/0199919 A1 Sep. 15, 2005

(30) Foreign Application Priority Data

Mar. 2, 2004 (JP) .............................. 2004-058110

(51) Int. Cl.
*H01L 23/62* (2006.01)
(52) U.S. Cl. .................................................. 257/335
(58) Field of Classification Search ........ 257/330–335, 257/337–347, E27.112
See application file for complete search history.

(56) References Cited

U.S. PATENT DOCUMENTS

| | | | |
|---|---|---|---|
| 6,632,712 B1 | 10/2003 | Ang et al. | |
| 6,696,330 B2 | 2/2004 | Forbes et al. | |
| 6,911,383 B2* | 6/2005 | Doris et al. | 438/588 |
| 2004/0100306 A1* | 5/2004 | Krivokapic et al. | 326/112 |
| 2006/0128071 A1* | 6/2006 | Rankin et al. | 438/131 |
| 2007/0161171 A1* | 7/2007 | Burnett et al. | 438/197 |

FOREIGN PATENT DOCUMENTS

| | | |
|---|---|---|
| JP | 10-093093 | 4/1998 |
| JP | 11-145481 | 5/1999 |
| JP | 2000-252470 | 9/2000 |
| JP | 2000-340795 | 12/2000 |
| JP | 2001-102442 | 4/2001 |
| JP | 2002-270850 | 9/2002 |
| JP | 2003-86795 | 3/2003 |
| JP | 2003-188273 | 7/2003 |
| JP | 2003-234474 | 8/2003 |

OTHER PUBLICATIONS

Bin Yu, et al., "FinFET Scaling To 10nm Gate Length", IEDM Tech. Dig., 2002, pp. 251-254.
Digh Hisamoto, et al., "FinFET-A Self-Aligned Double-Gate MOSFET Scalable To 20 nm", IEEE Trans.Electron Devices. vol. 47, No. 12, 2000, pp. 2320-2325.

* cited by examiner

*Primary Examiner*—Nathan W Ha
(74) *Attorney, Agent, or Firm*—Morgan, Lewis & Bockius LLP

(57) ABSTRACT

Upstanding thin-film channel regions 5 having different heights are formed between source regions 7 and drain regions 8 of MOS transistors, respectively.

12 Claims, 22 Drawing Sheets

SEMICONDUCTOR INTEGRATED CIRCUIT

BACKGROUND OF THE INVENTION

This invention relates to a semiconductor integrated circuit having a double-gate MOS field-effect transistor (MOSFET) and a method for manufacturing the same, and more particularly to a semiconductor integrated circuit having double-gate MOSFETs each with an upstanding channel region laterally formed and a method for manufacturing the same.

When miniaturization for realizing the high-integration and high-speed of the MOSFET is advanced, a source and drain approach each other so that a drain electric field affects the source, thereby deteriorating the device characteristic. This is generally called "short channel effect". This effect includes reduction in the threshold, slow-down of the rise of a drain current to a gate voltage (increase of S-factor), increase in the leak current between the source and drain, etc. On the other hand, as well known, a double-gate MOS gate structure in which a thin channel region is sandwiched between two gates can effectively shield the drain electric field, thereby suppressing the short-channel effect. Therefore, it has been considered that the double-gate MOSFET is suitable to a transistor structure most suitable to miniaturization.

There are three kinds of the double-gate MOSFET, inclusive of a planar type in which a thin channel layer is sandwiched by upper and lower two gates; an upstanding thin film lateral channel type in which an upstanding channel layer is sandwiched by two gates from the left and right sides to pass a current laterally (because the shape resembles a fin, it is often called a fin type; in this specification also, hereinafter referred to as the fin type); an upstanding thin film vertical channel type in which the upstanding thin channel layer is sandwiched between the two gates from the left and right sides to pass a current vertically. In recent years, the research and development of the fin type double-gate FET, because its manufacturing process is simple, has been actively advanced. Meanwhile, since the fin type MOSFET is generally formed on an SOI (Silicon-On-Insulator) substrate, the height of a silicon fin (Si-fin) serving as a channel (hereinafter also referred to as a silicon fin channel) is the same as the thickness of the silicon layer of the SOI substrate. Thus, the height of the fin channel is identical for all the transistors formed on the same substrate. In the fin type MOFET, although the value twice as large as the height of the silicon fin channel corresponds to an effective channel width, in order to increase an ON current, it is necessary to form a multi-fin channel (for example, see non-Patent Reference 1). In addition, in an actual integrated circuit, in order to constitute a CMOS inverter, since the mobility of holes is less than half of that of electrons, in consideration of balance of the current, the channel width of a p-channel MOSFET (pMOS) must be designed to be wider than those of an n-channel MOSFET (for example, see non-Patent Reference 2). Thus, where the CMOS inverter is formed by the fin type MOSFETs, the number of the fin channels of the pMOS will be made larger than that of the nMOS.

FIG. 14A is a plan view of a conventional CMOS integrated circuit formed using an SOI substrate. FIG. 14B is a sectional view taken in line A-A' in FIG. 14B. In FIG. 14, reference numeral 1 denotes a silicon substrate; 2 an embedded oxide film; 3p, 3n a gate electrode; 4 an insulating film; 5p, 5n a channel region; 6 a gate insulating film; 7p, 7n a source region; and 8p, 8n a drain region (subscript "p" represents pMOS, and subscript "n" represents nMOS). Like this, since it is necessary to realize large-current driving by increasing the number of the silicon fin channels, the device design and manufacturing process become complicate. Further, if the number of the silicon fin channels is increased, the area of the multi-fin MOSFET correspondingly increases, thus leading to a disadvantage of reduction in the degree of integration.

Further, in the double-gate MOSFET which shows its feature when the thin channel layer is miniaturized, as a technique of controlling the threshold voltage indispensable to the CMOS circuit, impurity control in the channel region which has been usually adopted is not effective. This is because in the miniaturized double-gate FET having the very thin channel layer, a problem of the variation in the impurity concentration occurs, thus leading to a variation in the threshold voltage.

In order to solve such a problem, there has been proposed a structure for improving the double-gate MOSFET. This structure adopts a system in which the gate electrodes sandwiching a lateral channel being physically separated and electrically insulated from each other, and with a fixed bias voltage being applied to the one gate electrode, the transistor is driven using the other gate electrode, thereby realizing control of the threshold voltage (for example, see Patent Reference 1). FIG. 15A is a plan view showing the MOS structure proposed forth is purpose. FIG. 15B and FIG. 15C are sectional views taken in line A-A' and line B-B' in FIG. 15A, respectively. In FIG. 15, like reference numerals refer to like elements in FIG. 14. In FIG. 15, reference numeral 3 denotes a gate electrode; 5 a channel region; 7 a source region; and 8 a drain region. By varying the value of the fixed bias voltage applied to the one gate electrode of the double-gate MOSFET, the threshold voltage of the transistor varies, thereby permitting the threshold voltage to be controlled. However, where the threshold voltage is controlled using the one gate voltage, there is a problem that a driving current necessarily falls. Further, in an actual CMOS circuit, since the mobility of holes in the pMOS is less than that of electrons in the nMOS, in assembling an inverter, current matching based on channel width designing is indispensable. However, the above patent reference does not entirely consider such current driving capability.

In the four-terminal fin type MOSFET structure proposed in Patent Reference 1, since the gate insulating films on both sides of the channel region are simultaneously formed, they have the same thickness. Varying the fixed potential of the one gate electrode surely permits the threshold voltage of the transistor to be controlled, but provides a disadvantage of abruptly increasing the S factor. In order to obviate such a disadvantage, the inventors of this invention have proposed a four-terminal fin type MOSFET having asymmetrical gate insulating films as shown in FIG. 16 (Japanese Patent Appln. No. 2003-40793). FIG. 16A is a plan view showing a device structure thereof. FIG. 16B, 16C are sectional views taken in line A-A' and line B-B' in FIG. 16A, respectively. In FIG. 16, like reference numerals refer to like elements in FIG. 15. In FIG. 16, reference numerals 61 and 62 denote gate insulating films having different film thicknesses. In this device structure, by making the thickness of the gate insulating film on the control side larger than the thickness of the gate insulating film on the driving side, the problem of the abrupt increase in the S factor is solved and also the threshold voltage is controlled.

Patent Reference 1
  JP-A-2002-270850

Non-Patent Reference 1

D. Hisamoto, et al., "FinFET-A Self-Aligned Double-gate MOSFET Scalable to 20 nm", IEEE Trans. Electron Devices, Vol. 47, No. 12, 2000, pp. 2320-2325.

Non-Patent Reference 2

Bin YU, et al., "FinFET Scaling to 10 nm Gate Length", IEDM Tech. Dig., 2002, pp. 251-254.

In the prior art shown in FIG. 14, the occupied area of the device increases, thus reducing the integration degree. Further, in the CMOS inverter having the structure shown in FIG. 14, the channel width of the pMOS can be formed only integer times as large as the channel width of the nMOS so that the current matching could not be done accurately. In addition, since the gate electrodes are coupled with each other, the threshold voltage cannot be controlled using the gate voltage. Further, in also the four-terminal fin type MOSFET shown in FIG. 15 which can control the threshold voltage using the gate electrode and also the four-terminal fin type MOSFET shown in FIG. 16 which can solve the problem of the abrupt increase in the S factor, the multi-fin structure must be adopted for the purpose of the current matching in the CMOS inverter. In these prior arts also, like the first prior art, reduction in the integration degree is problematic.

SUMMARY OF THE INVENTION

This invention intends to solve the problems of the above prior arts. A first object thereof is to provide a semiconductor integrated circuit in which transistors with the same area are formed on the same substrate to have upstanding thin film lateral channels having different channel heights. A second object thereof is to provide a semiconductor integrated circuit provided with double-gate MOSFETs which can give high integration degree by realizing the current matching in a CMOS circuit without adopting a multi-fin structure.

In order to attain the above objects, in accordance with this invention, there is provided a semiconductor integrated circuit including: a plurality of double-gate MOSFETs formed on the same substrate, each of the MOSFETs (field effect transistors) including; an upstanding thin-film lateral channel region of semiconductor; a source region and a drain region which are formed adjacently to the lateral ends of the upstanding thin film lateral channel region; and gate insulating films and gate electrodes formed on both sides of the upstanding thin film lateral channel region, characterized in that the semiconductor integrated circuit includes two double-gate MOSFETs with the upstanding lateral channel regions having different heights.

Further, in order attain the above objects, in accordance with this invention, there is provided a method for manufacturing a semiconductor integrated circuit including the steps of: partially forming a lower height region with a thinner film thickness by partially removing a semiconductor layer having a predetermined thickness formed on a supporting substrate; and forming double-gate MOSFETs (field effect transistors) having upstanding thin-film lateral channel regions of the semiconductor layer which are upstanding on a region of the semiconductor layer having the predetermined thickness and the lower height region, respectively, a source region and a drain region which are formed adjacently to the lateral ends of each of the upstanding thin film lateral channel regions, and gate insulating films and gate electrodes formed on both sides of each of the upstanding thin film lateral channel regions.

In order to attain the above objects, there is provided a method for manufacturing a semiconductor integrated circuit including the steps of: partially forming a lower height region having a thinner film thickness by partially removing a semiconductor layer having a predetermined thickness formed on a first supporting substrate; depositing and polishing an insulating film so that the surface thereof is flattened; bonding a second supporting substrate to the insulating film; removing the first supporting substrate; and forming double-gate MOSFETs (field effect transistors) having upstanding thin-film lateral channel regions of the semiconductor layer which are upstanding on a region of the semiconductor layer having the predetermined thickness and the lower height region, respectively, a source region and a drain region which are formed adjacently to the lateral ends of each of the upstanding thin film lateral channel regions, and gate insulating films and gate electrodes formed on both sides of each of the upstanding thin film lateral channel regions.

In order to attain the above objects, in accordance with this invention, there is provided a method for manufacturing a semiconductor integrated circuit including the steps of: partially forming a lower height region having a thinner film thickness by partially removing a semiconductor layer having a predetermined thickness formed on a first supporting substrate; forming double-gate MOSFETs (field effect transistors) having upstanding thin-film lateral channel regions of the semiconductor layer which are upstanding on a region of the semiconductor layer having the predetermined thickness and the lower height region, respectively, a source region and a drain region which are formed adjacently to the lateral ends of each of the upstanding thin film lateral channel regions, and gate insulating films and gate electrodes formed on both sides of each of the upstanding thin film lateral channel regions; depositing and polishing an insulating film so that the surface thereof is flattened; bonding the insulating film and another insulating film on other double-gate MOSFETs having the same structure, and mulitilayering the double-gate MOSFETs.

BRIEF DESCRIPTION OF THE DRAWINGS

FIGS. 12A and 12B are a plan view and a sectional view showing the ninth embodiment of this invention.

DETAILED DESCRIPTION OF THE PREFERRED EMBODIMENTS

Figure 1A:
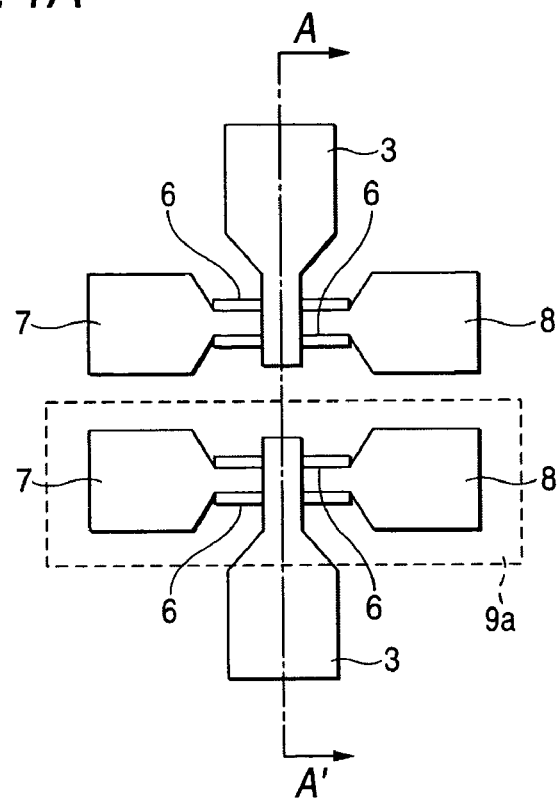
FIGS. 1A and 1B are a plan view and a sectional view showing the first embodiment of this invention.

Now referring to the drawings, a detailed explanation will be given of the mode of carrying out the invention in line with various embodiments.

Embodiment 1

Figure 1B:
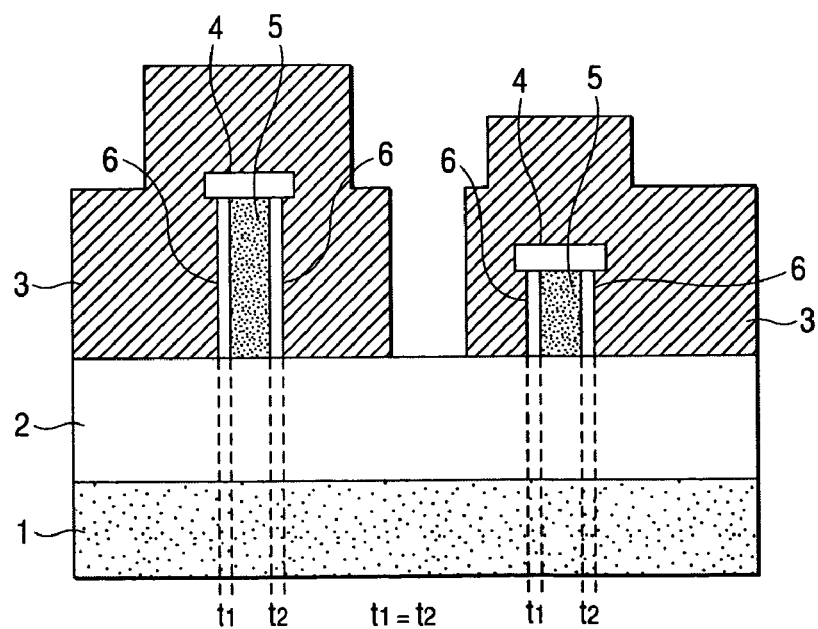

FIG. 1 shows the first embodiment of this invention. FIG. 1A is a plan view of a semiconductor integrated circuit having double-gate MOSFETs with the silicon fins having different heights formed on an SOI substrate. FIG. 1B is a sectional view taken in line A-A' in FIG. 1A. In FIG. 1, reference numeral 1 denotes a silicon (Si) substrate; 2 an embedded oxide film; 3 one of gate electrodes; 4 one of insulating films; and 5 one of channel regions partially formed in a silicon crystal layer. As seen from FIG. 1B, the height of the fin channel of the transistor on the left side is higher than the height of the fin channel of the transistor on the right side. Reference numeral 6 denotes one of gate insulating films; 7 one of source regions partially formed in the silicon crystal layer; 8 one of drain regions partially formed in the silicon crystal layer; and 9a a selectively-oxidized region. In this embodiment, the gate insulating films formed on both sides of the channel region of each of the transistors have the same film thickness. Namely, assuming that the film thicknesses of the gate insulating films are $t_1$ and $t_2$, $t_1=t_2$.

FIGS. 2A to 2J show an exemplary manufacturing process of the semiconductor integrated circuit according to the first embodiment of this invention.

Figure 2A:
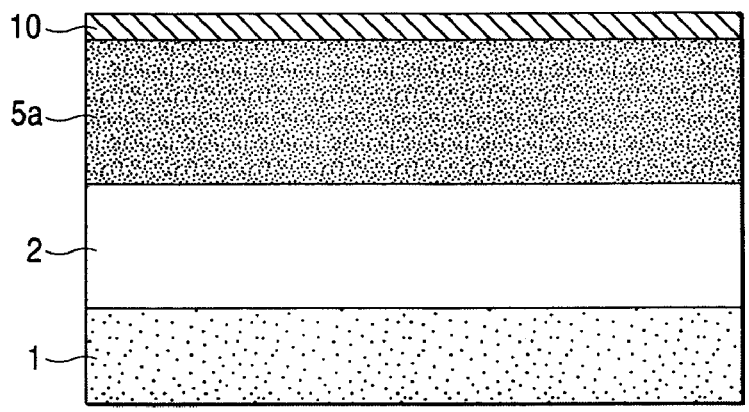
FIGS. 2A to 2C are sectional views of the manufacturing process the first embodiment of this invention in order of steps therein (No. 1).
Figure 2B:
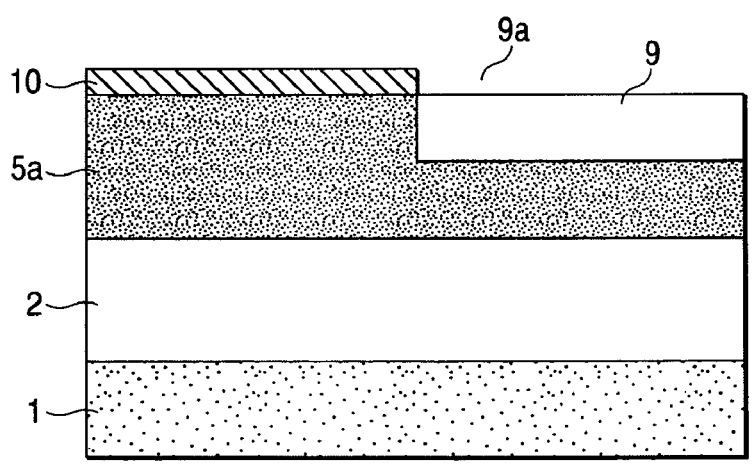

First, as shown in FIG. 2A, an SOI (Silicon-On-Insulator) wafer having an embedded oxide film 2 and a silicon crystal layer 5a is prepared on an Si substrate 1, and an oxidation passivation film 10 consisting of a thermal oxidation film and nitride film is formed on the SOI wafer.

Next, by photolithography and reactive ion etching (RIE) technique, the oxidation passivation film 10 for the selectively-oxidized region 9a is selectively etched away. Thereafter, as seen from FIG. 2B, by thermal oxidation, a selectively-oxidized film 9 is formed on the area with the oxidation passivation film etched away.

Figure 2C:
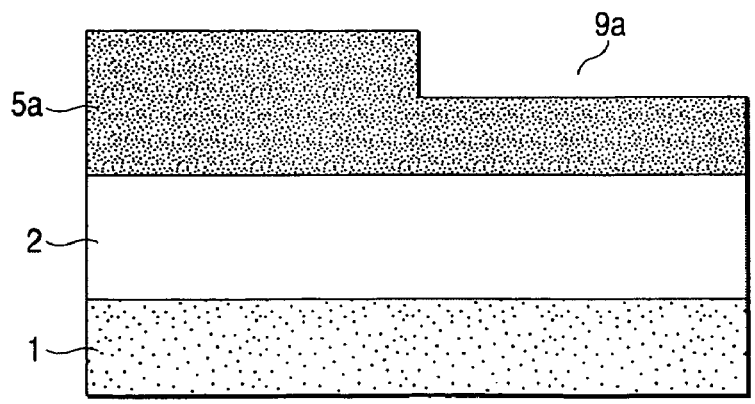

Next, when the oxidation passivation film 10 and selectively-oxidized film 9 are etched by RIE and wet etching using hydrofluoric acid, the SOI substrate as shown in FIG. 2C in which the thickness of the silicon crystal layer partially varies can be formed. By repeating the steps of FIG. 2A to 2C, the SOI substrate having a plurality of silicon layer thicknesses can be formed.

Figure 2D:
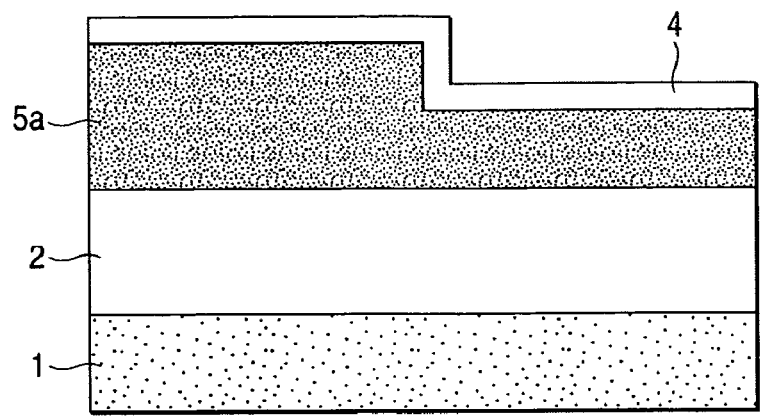
FIGS. 2D to 2F are sectional views of the manufacturing process the first embodiment of this invention in order of steps therein (No. 2).

Next, an oxide film is formed on the entire silicon layer by thermal oxidation, and a doping mask is made by electron beam exposure/development and RIE. Doping is executed for the regions constituting the source region and drain region. The doping mask is removed using hydrofluoric acid. This process, which consists of steps generally employed, is not shown. Subsequently, as shown in FIG. 2D, an insulating film 4 consisting of only a thermal oxidation film (in the case of Embodiments 1 and 2) and of the thermal oxidation film and a nitride film (in the cases of Embodiments 3 and 4) is formed.

Figure 2E:
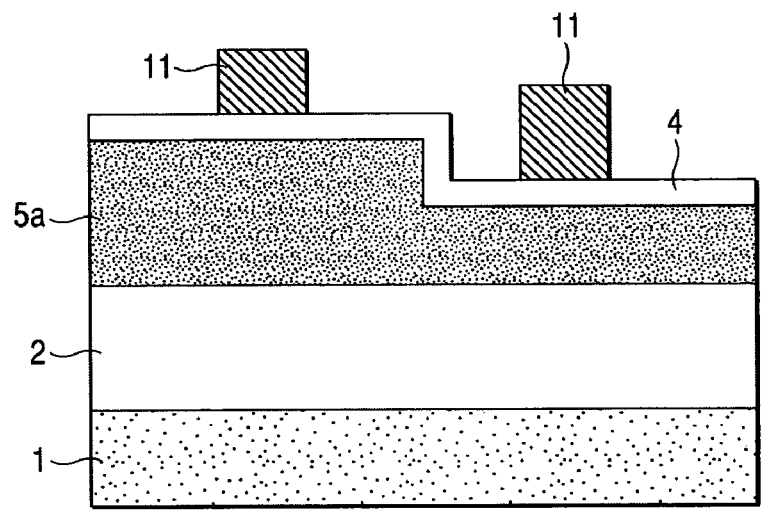

Next, as shown in FIG. 2E, resist films 11 each for a minute channel are formed by electron beam exposure/development.

Figure 2F:
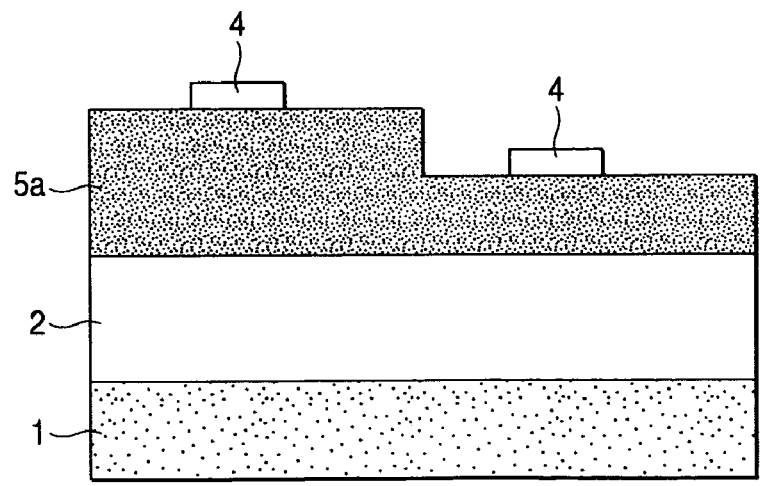

By RIE using the resist films 11 as a mask, the insulating film 4 is selectively etched, thereby forming hard masks each made of the insulating film 4 as shown in FIG. 2F.

Figure 2G:
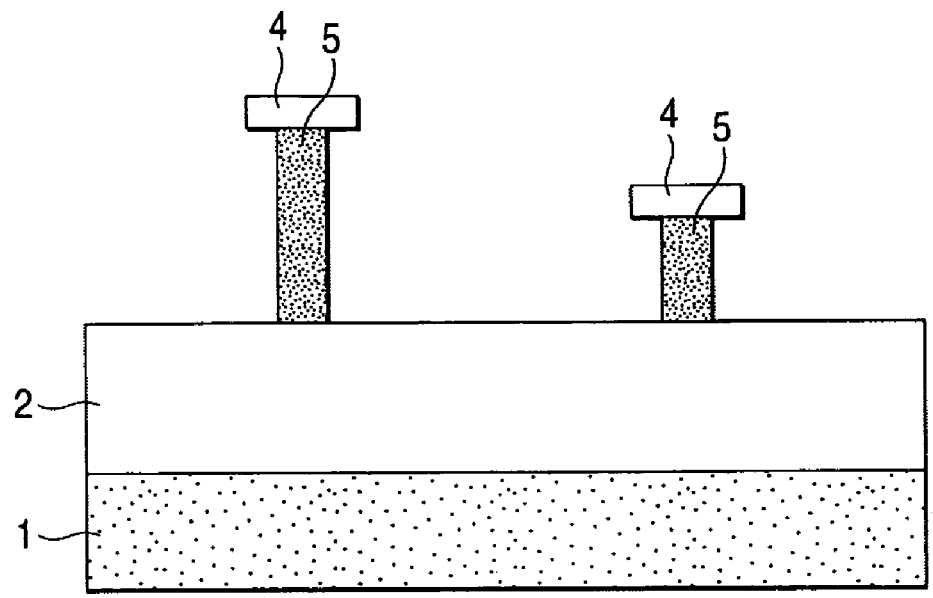
FIGS. 2G and 2H are sectional views of the manufacturing process the first embodiment of this invention in order of steps therein (No. 3).

By crystal anisotropy wet etching or RIE using the insulating films 4 as a mask, the silicon crystal layer 5a is etched. Thus, as shown in FIG. 2G, the channel regions 5 having different heights are formed. Where the silicon fin is formed by crystal anisotropy wet etching, with the plane orientation of the silicon layer being (110), the longitudinal direction of the fin must be aligned with <112> orientation. The silicon fin formed by this technique serves as an ideal square channel. The channel surface has a (111) orientation, and is smooth or flat in the level of an atomic layer level. On the other hand, where the silicon fin is formed by RIE, the plane orientation of the silicon layer is not limited. However, the silicon fin thus formed generally has a bell shape so that the channel surface will be subjected to damage by plasma.

Figure 2H:
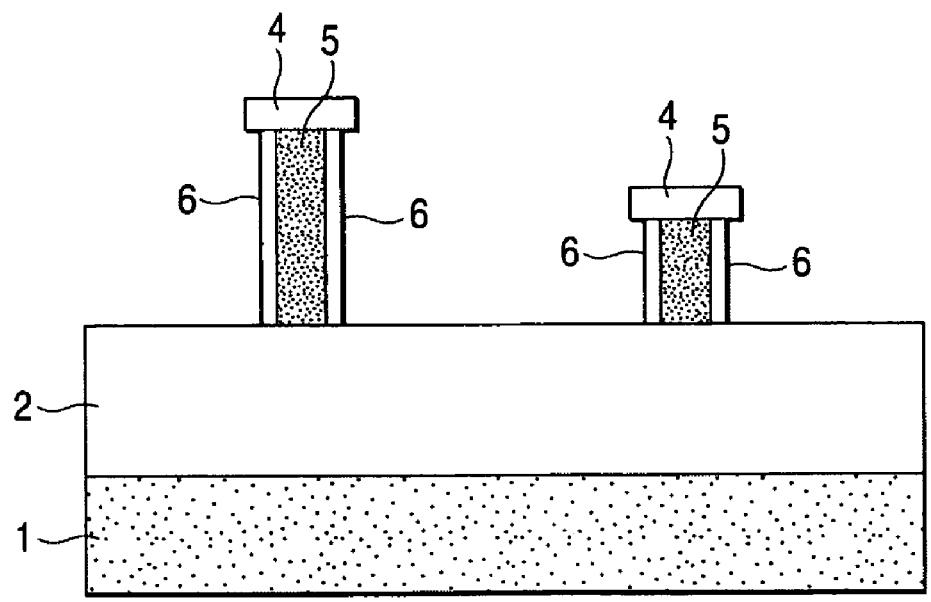
Figure 2I:
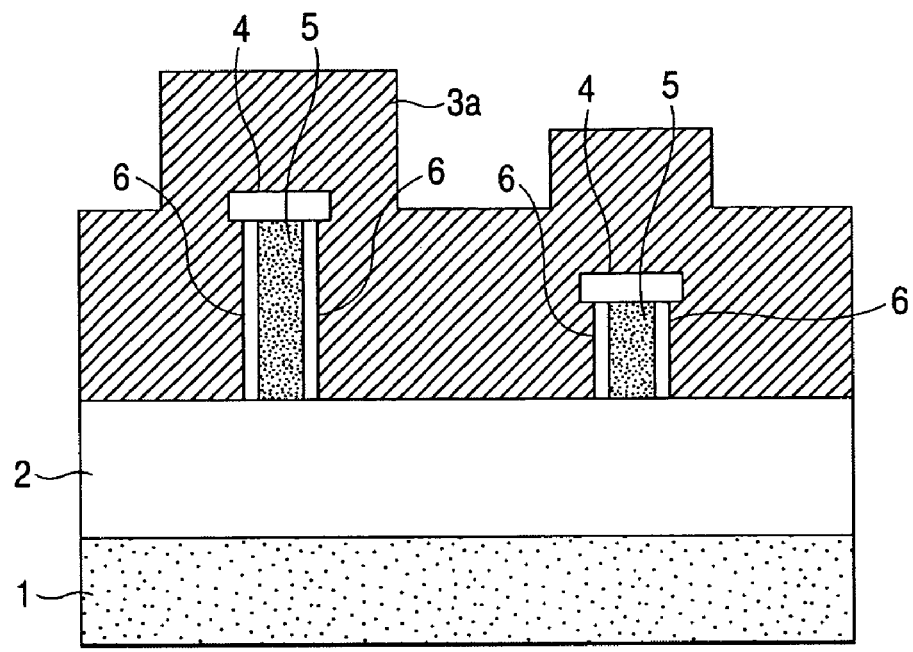
FIGS. 2I and 2J are sectional views of the manufacturing process the first embodiment of this invention in order of steps therein (No. 4).
Figure 2J:
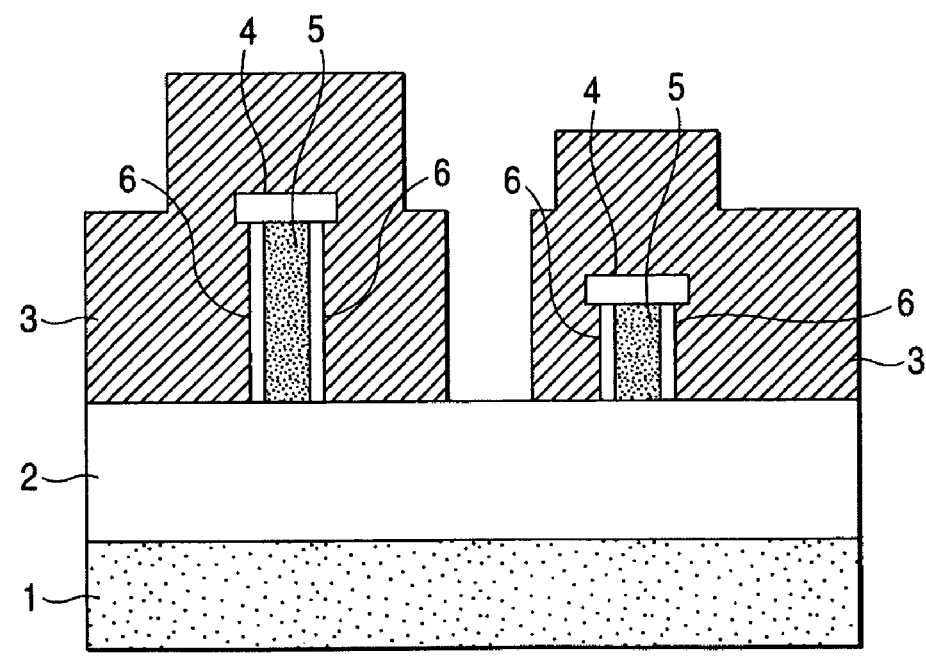

Next, as shown in FIG. 2H, the gate insulating films 6 are formed by thermal oxidation. Further, as shown in FIG. 2I, an electrode material layer 3a is deposited. The electrode material may be a doped polysilicon, or a composite film consisting of a thin refractory metallic film and doped polysilicon which are continuously deposited. Next, as shown in FIG. 2J, gate patterning and gate machining are done by electron beam exposure/development and RIE, thereby forming the gate electrodes 3 for the respective transistors. Finally, doping is done for the extension areas at both ends of the silicon fin channel through the annealing (RTA) by instantaneous heating. Deposition of the insulating film, forming contact holes, forming Al electrodes and sintering are executed. Thus, the process of manufacturing the semiconductor integrated circuit of the double-gate MOSFETs having different heights of the silicon fins is completed.

When the silicon fin channel of the fin type MOSFET according to this invention is formed by crystal anisotropy wet etching, the channel region will not suffer from the damage by plasma. Further, the channel surface is oriented to the (111) plane in a self-aligned manner and hence is made flat on the order of the atomic layer. This gives a small reduction in the mobility of carriers due to Raffinence scattering on the channel surface, thereby providing a high performance field effect transistors.

In accordance with the fin type MOSFET structure according to this invention, since the source region, drain region and both gate electrodes are arranged on the same main surface, wiring between devices can be easily made. With the channel regions previously processed in the manufacturing process, both gate electrodes are processed in the same manufacturing process so that the source regions, drain regions and both gate electrodes can be aligned in a self-aligned manner. Thus, the structure according to this invention can prevent deterioration of the device performance due to parasitic capacity and variation of parasitic source/drain resistance.

Embodiment 2

Figure 3A:
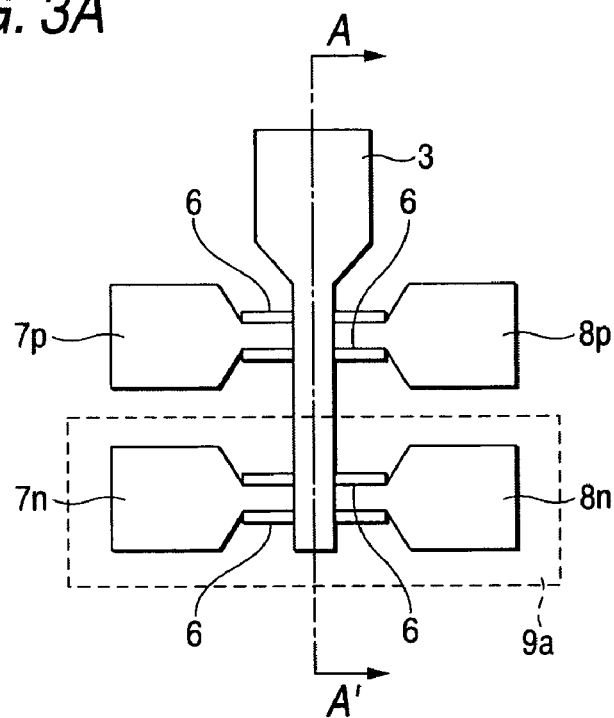
FIGS. 3A and 3B are a plan view and a sectional view showing the second embodiment of this invention.
Figure 3B:
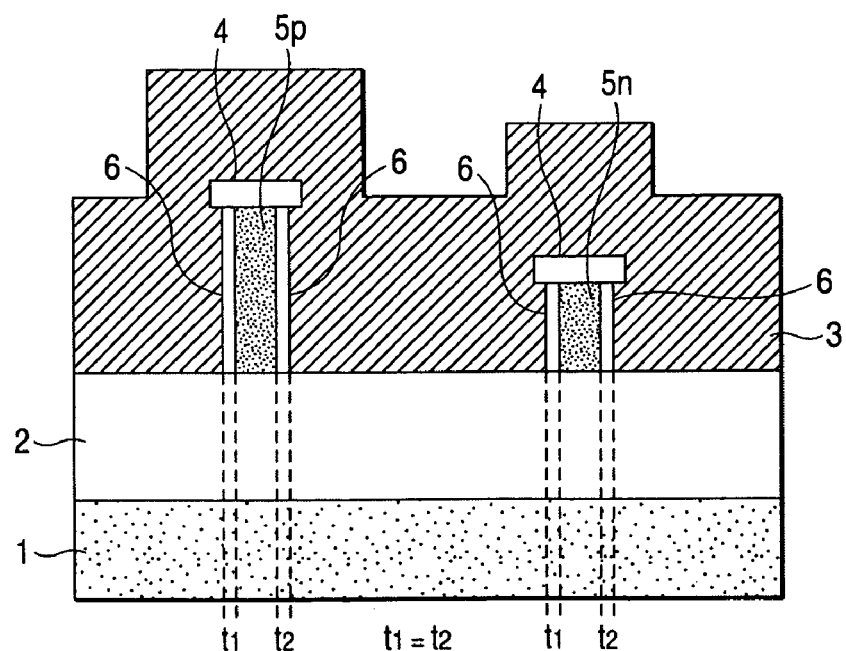

FIG. 3 shows the second embodiment of this invention. FIG. 3A is a plan view of a CMOS inverter having double-gate MOSFETs with different heights of the silicon fins formed on an SOI substrate. FIG. 3B is a sectional view taken in line A-A' in FIG. 3A. In FIG. 3, like reference numerals referring to like elements in the first embodiment will not be explained. In FIG. 3, reference numerals 5p, 7p and 8p denote the channel region, source region and drain region of the pMOS, respectively; and reference numerals 5n, 7n and 8n denote the channel region, source region and drain region of the nMOS, respectively. In this embodiment, the gate electrode 3 is commonly formed for the pMOS and nMOS, and the drain region 8p of the pMOS and the drain region 8n of the nMOS are connected to each other through a contact metal layer 12.

The manufacturing process in the second embodiment is basically the same as that in the first embodiment, but is different therefrom in the following three points.

(1) In the doping for the source/drain regions as shown in FIG. 2C, the silicon fin channel having a higher height is doped with p-type impurities whereas the silicon fin channel having a lower height is doped with n-type impurities.

(2) In the gate processing as shown in FIG. 2J, the gates for the silicon fin channels having the higher and lower heights are connected to each other.

(3) The insulating film (not shown) overlying the transistors is selectively removed to make a contact hole, and the drain region 8p and drain region 8n are connected to each other through the contact metallic layer 12.

Embodiment 3

Figure 4A:
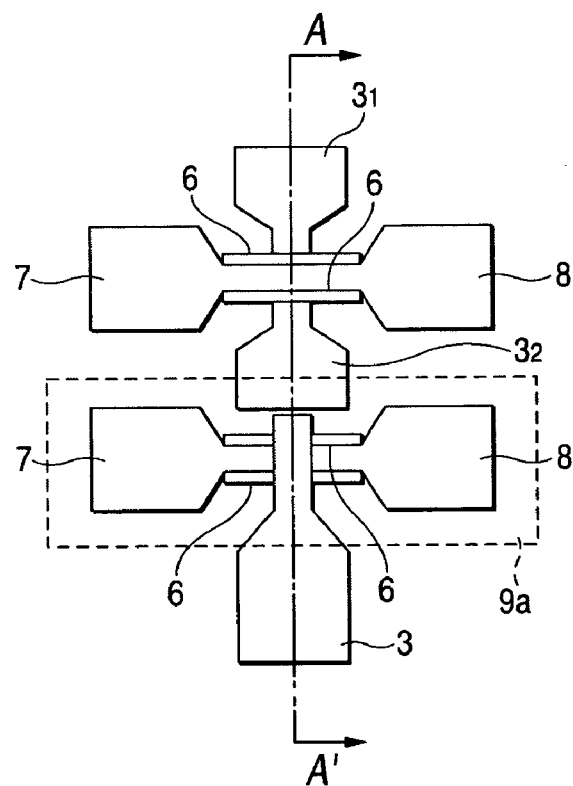
FIGS. 4A and 4B are a plan view and a sectional view showing the third embodiment of this invention.
Figure 4B:
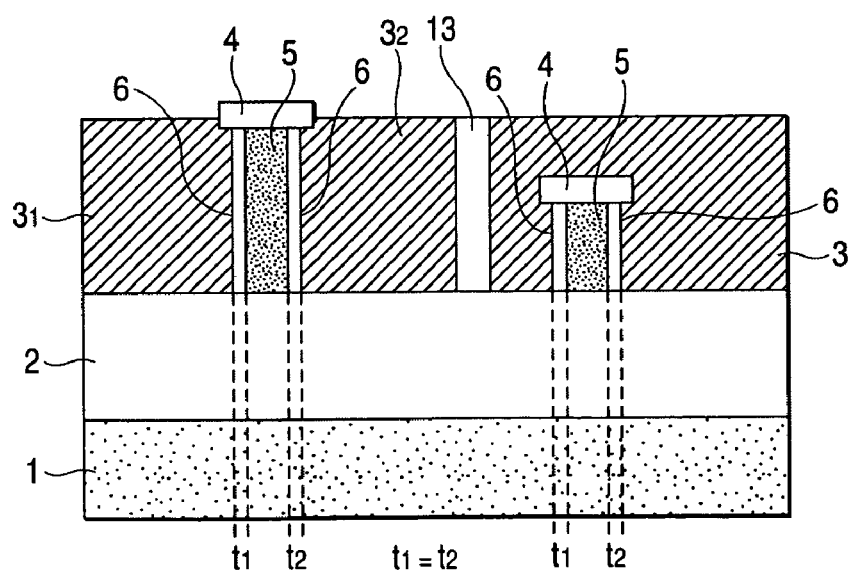

FIG. 4 shows the third embodiment of this invention. FIG. 4A is a plan view of a semiconductor integrated circuit having double-gate MOSFETs with different heights of the silicon fins formed on an SOI substrate according to this embodiment. FIG. 4B is a sectional view taken in line A-A' in FIG. 4A. In FIG. 4, like reference numerals referring to like elements in the first embodiment shown in FIG. 1 will not be explained. In FIG. 4B, reference numeral 13 denotes a CVD oxide film separating the transistors from each other. In this embodiment, the gate electrode of the transistor with a higher fin channel is divided into a gate electrode 3$1_1$ and a gate electrode 3$_2$.

The manufacturing process in the third embodiment is basically the same as that in the first embodiment, but is different therefrom in the following two points.

(1) The insulating film 4 must be a composite film of a thermal oxidation film and nitride film. This is because this insulating film is used as a stopper during CPM.

(2) After doping for the extension areas of the source/drain regions by RTA has been completed, a CVD oxide film is deposited. Using CMP, it is polished to the insulating film 4 (stopper) at the head of the silicon fin channel having the higher height.

Embodiment 4

Figure 5A:
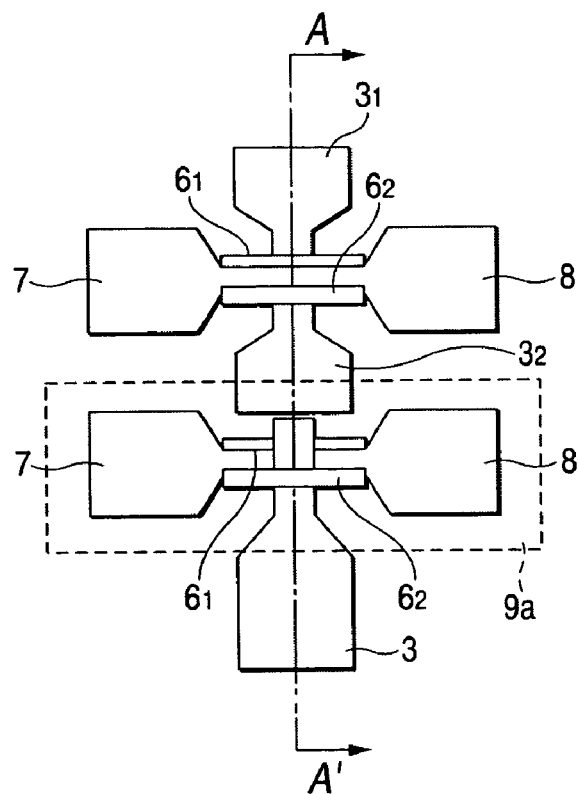
FIGS. 5A and 5B are a plan view and a sectional view showing the fourth embodiment of this invention.
Figure 5B:
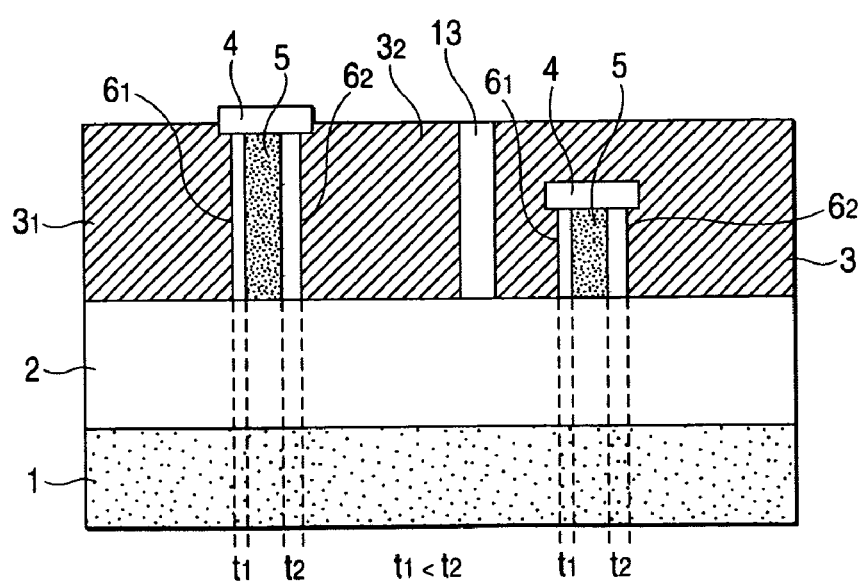

FIG. 5 shows the fourth embodiment of this invention. FIG. 5A is a plan view of a semiconductor integrated circuit having double-gate MOSFETs with different heights of the silicon fins formed on an SOI substrate according to this embodiment. FIG. 5B is a sectional view taken in line A-A' in FIG. 5A. In FIG. 5, like reference numerals referring to like elements in the third embodiment shown in FIG. 4 will not be explained. In this embodiment, the pair of gate insulating films formed to have different film thicknesses. In FIG. 5, reference numeral 61 denotes the gate insulating film with a larger film thickness and reference 62 denotes the gate insulating film a smaller film thickness. Namely, assuming that the respective film thicknesses of the gate insulating films are $t_1$ and $t_2$, $t_1 < t_2$.

The manufacturing process in the fourth embodiment is basically the same as that in the third embodiment, but is different therefrom in the following one point.

(1) In forming the silicon fins, first, the silicon fin side surface on the one side thereof is previously formed and a thicker gate insulating film is formed on this silicon fin side surface. Thereafter, by precise alignment light exposure, the silicon fin side on the other side is formed, and a thinner gate insulating film is formed on this silicon fin side.

Embodiment 5

Figure 6A:
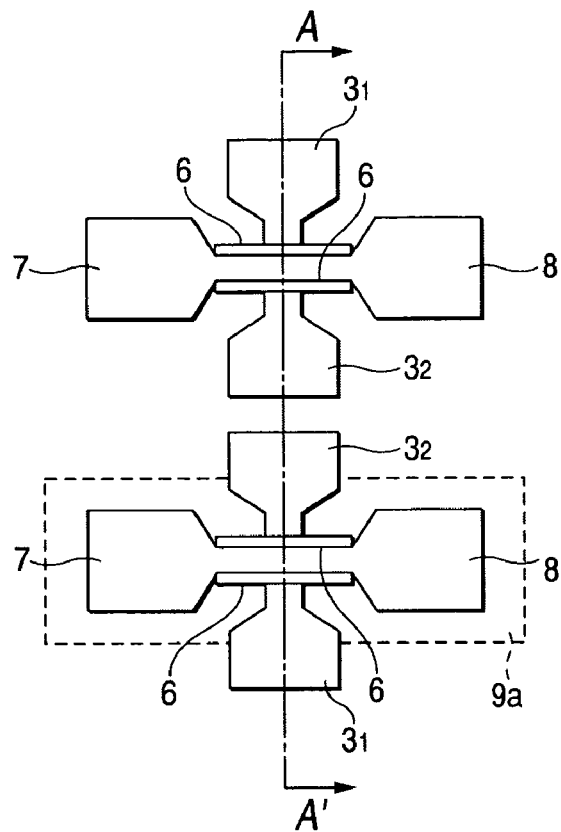
FIGS. 6 and 6B are a plan view and a sectional view showing the fifth embodiment of this invention.
Figure 6B:
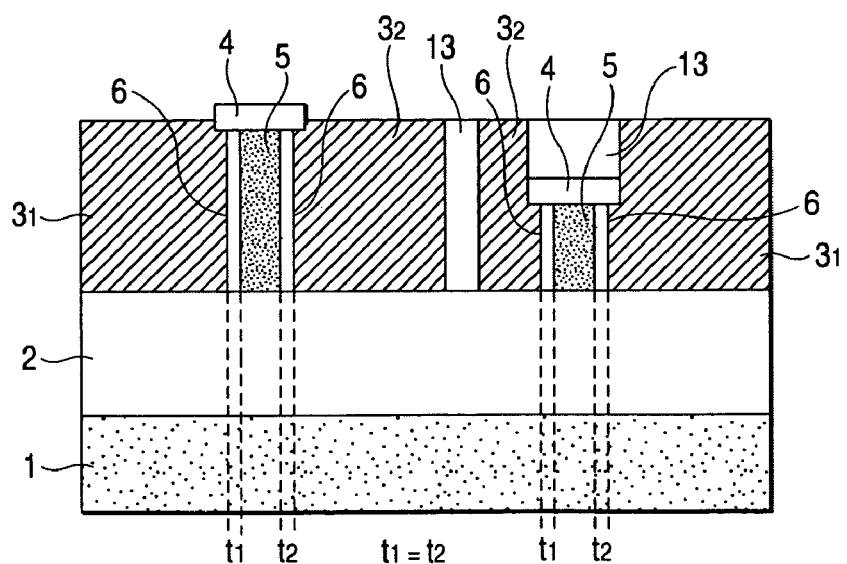

FIG. 6 shows the fifth embodiment of this invention. FIG. 6A is a plan view of a semiconductor integrated circuit having double-gate MOSFETs with different heights of the silicon fins formed on an SOI substrate according to this embodiment. FIG. 6B is a sectional view taken in line A-A' in FIG. 6A. In FIG. 6, like reference numerals referring to like elements in the third embodiment shown in FIG. 4 will not be explained. In this embodiment, not only the gate electrode of the transistor with the silicon fin channel having the higher height but also the gate electrode of the transistor with the silicon fin channel having the lower height is divided into the gate electrode 31 and the gate electrode 32.

The manufacturing process in the fifth embodiment is basically the same as that in the third embodiment, but is different therefrom in the following one point.

(1) In the gate processing (in patterning the electrode material layer 3a), a slit is made on the silicon fin having the lower height.

Embodiment 6

Figure 7A:
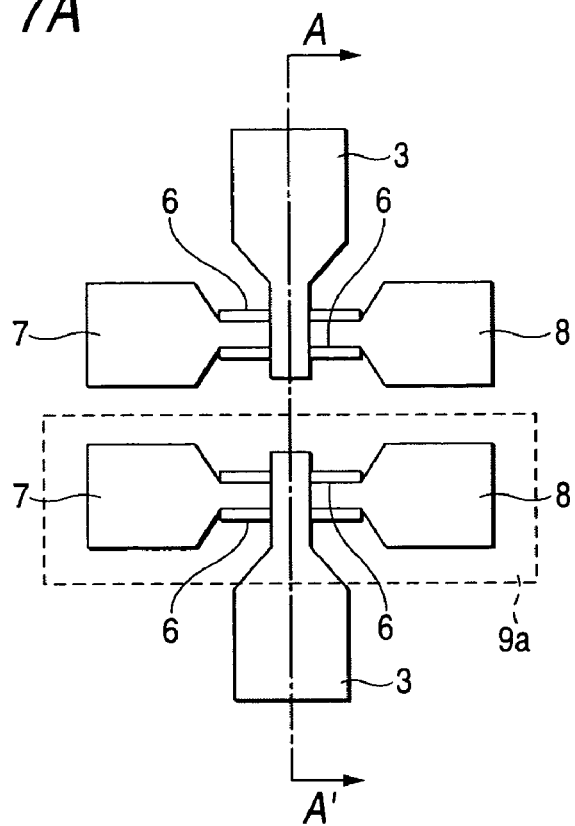
FIGS. 7A and 7B are a plan view and a sectional view showing the sixth embodiment of this invention.
Figure 7B:
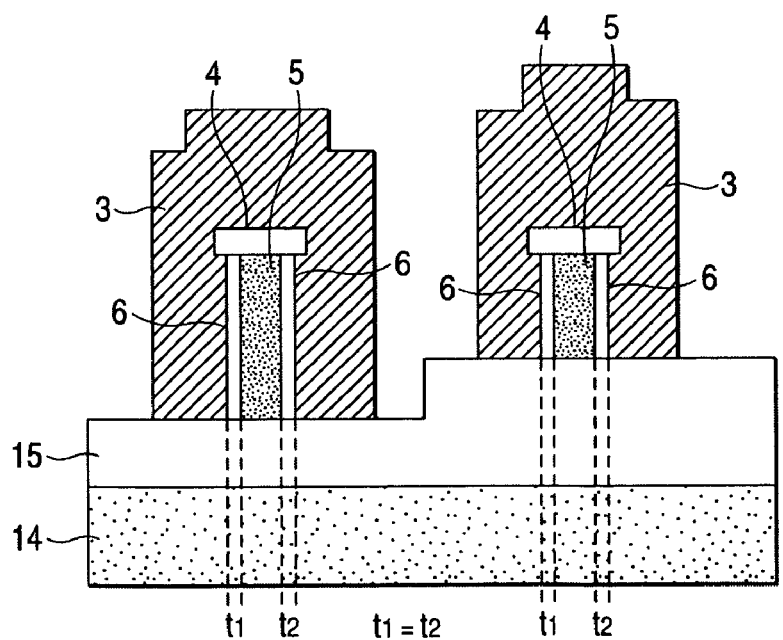

FIG. 7 shows the sixth embodiment of this invention. FIG. 7A is a plan view of a semiconductor integrated circuit having double-gate MOSFETs with the silicon fins formed on an SOI substrate, having different heights and tops located in flush with each other according to this embodiment. FIG. 7B is a sectional view taken in line A-A' in FIG. 7A. In FIG. 7, like reference numerals referring to like elements in the first embodiment shown in FIG. 1 will not be explained. In FIG. 7, reference numeral 14 denotes a silicon (Si) supporting substrate, and reference numeral 15 denotes a CVD oxide film.

FIGS. 8A to 8L show an exemplary manufacturing process of the semiconductor integrated circuit according to the sixth embodiment of this invention.

Figure 8A:
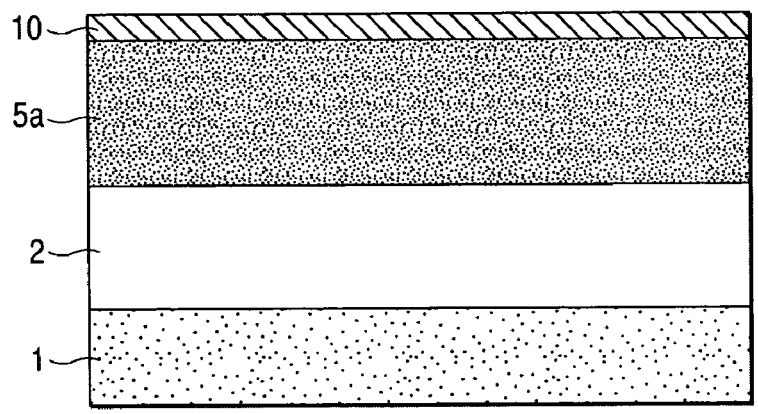
FIGS. 8A to 8C are sectional views of the manufacturing process the sixth embodiment of this invention in order of steps therein (No. 1).
Figure 8B:
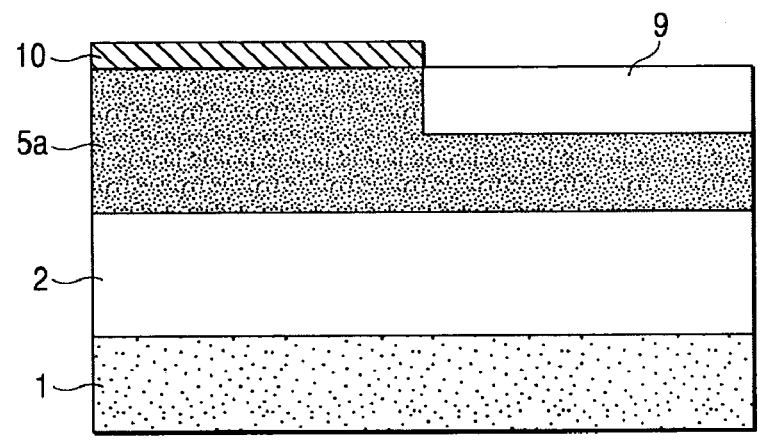
Figure 8C:
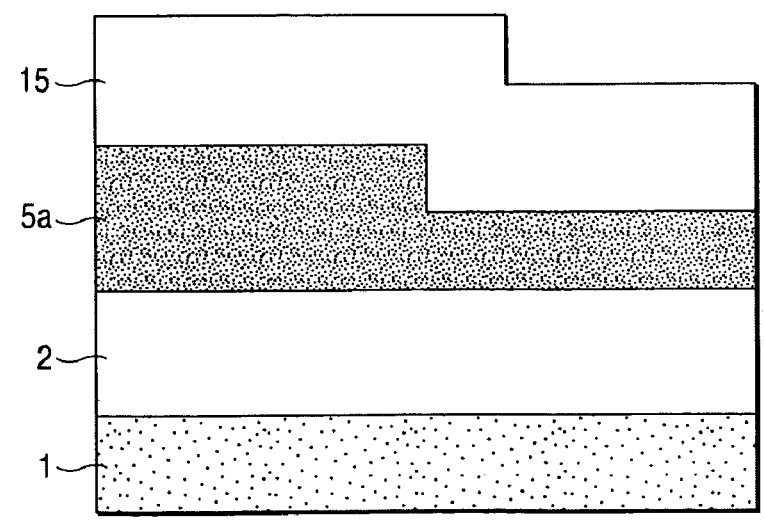

First, as shown in FIG. 8A, an SOI (Silicon-On-Insulator) wafer having an embedded oxide film 2 and a silicon crystal layer 5a is prepared on an Si substrate 1 and an oxidation passivation film 10 consisting of a thermal oxidation film and nitride film is formed on the SOI wafer.

Figure 8D:
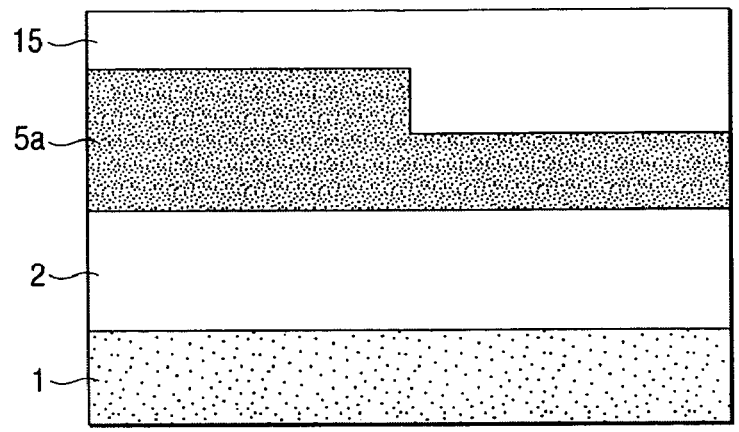
FIGS. 8D to 8F are sectional views of the manufacturing process the sixth embodiment of this invention in order of steps therein (No. 2).

Next, by photolithography and reactive ion etching (RIE) technique, the oxidation passivation film 10 is selectively etched away. Thereafter, as seen from FIG. 8B, by thermal oxidation, a selectively-oxidized film 9 is formed on the area with the oxidation passivation film 10 etched away. Next, by RIE and hydrofluoric acid treatment, the oxidation passivation film 10 and the selectively-oxidized film 9 are etched away. By repeating the steps of forming the oxidation passivation film 10, thermal oxidation and etching, the SOI substrate having a plurality of silicon layer thicknesses can be formed. Next, as shown in FIG. 8, a thick CVD oxide film 15 having a height exceeding the level difference in the silicon crystal layer 5a is deposited. Next, as shown in FIG. 8D, using CMP, the CVD oxide film 15 is flattened. In this case, the CVD oxide film is flattened to be left on a thicker area of the silicon crystal layer 5a.

Figure 8E:
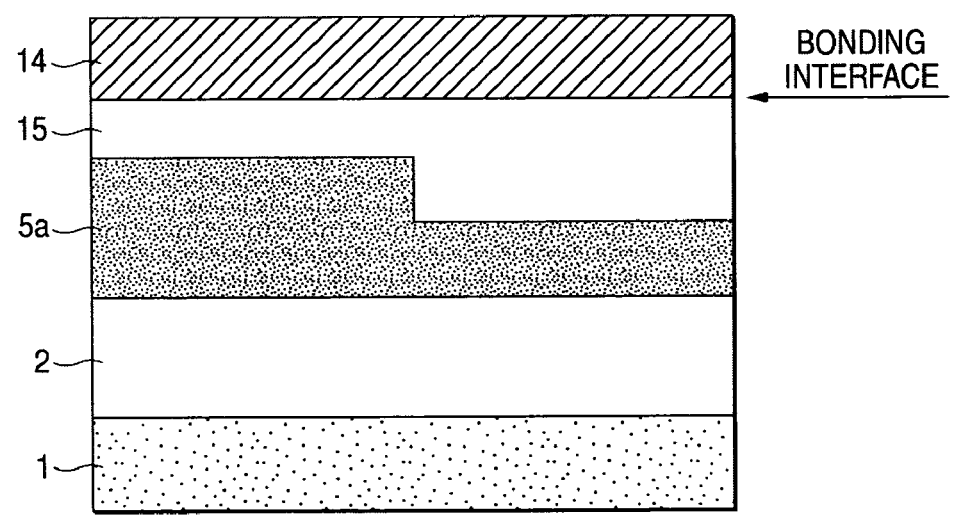

Next, as shown in FIG. 8E, a prepared silicon supporting substrate 14 is bonded to the flattened CVD oxide film 15 on the SOI wafer, and annealed. Thus, the silicon supporting substrate 14 and the SOI wafer having the silicon crystal layer 5a are brought into intimate contact with each other by chemical bonding.

Figure 8F:
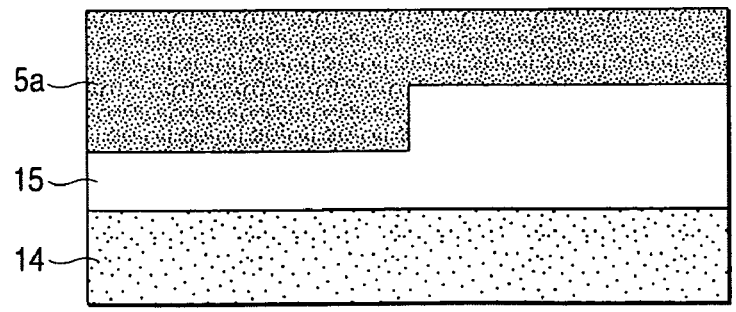

Next, as shown in FIG. 8F, the silicon substrate 1 is removed by a "lost wafer" technique. The "lost wafer" technique includes wet etching of dissolving the silicon in an organic alkaline solution and dry etching using deep-RIE (deep Reactive Ion Etching). Both techniques are very effective for the process in this embodiment. It should be noted after the step of "lost-wafer" that as shown in FIG. 8F, the silicon crystal layer 5a partially varies in height but its top is flat and flush. Thus, a new SOI wafer with the silicon crystal layer having a level difference will be formed.

Figure 8G:
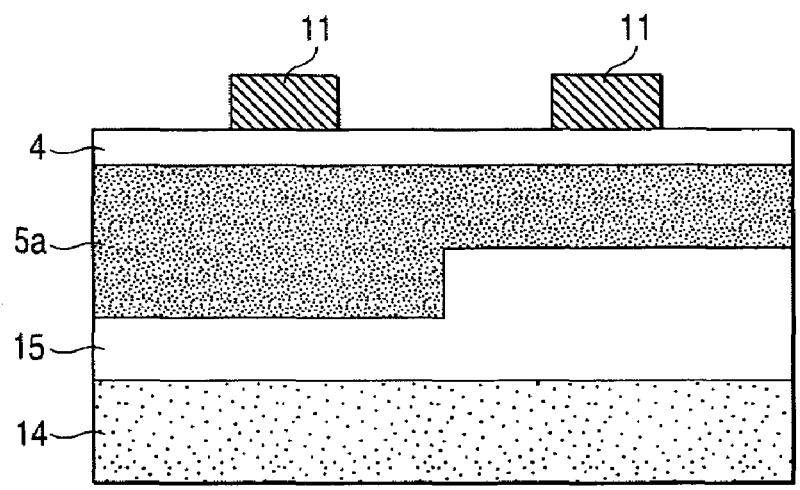
FIGS. 8G to 8I are sectional views of the manufacturing process the sixth embodiment of this invention in order of steps therein (No. 3).

Next, an oxide film is formed on the entire silicon layer by thermal oxidation, and a doping mask is made by electron beam exposure/development and RIE. Doping is executed for the regions constituting the source region and drain region. The doping mask is removed using hydrofluoric acid. This process, which consists of steps generally employed, is not shown. Subsequently, as shown in FIG. 8G, an insulating film 4 consisting of only a thermal oxidation film or of the thermal oxidation film and a nitride film is formed. Further, resist films 11 for a fin channel pattern are formed by electron beam exposure/development.

Figure 8H:
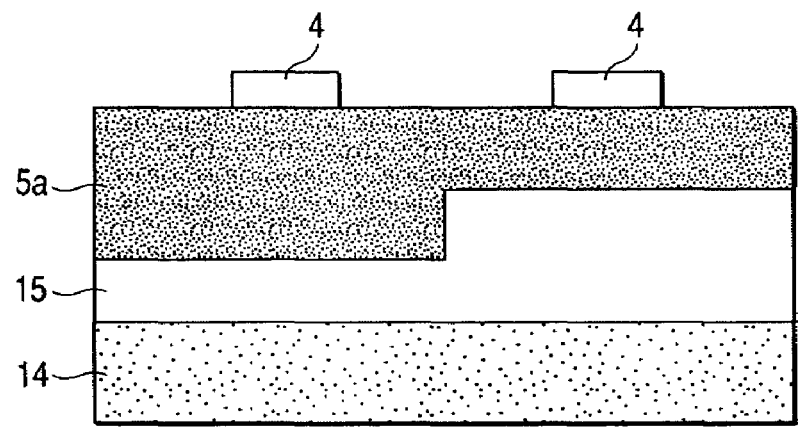
Figure 8I:
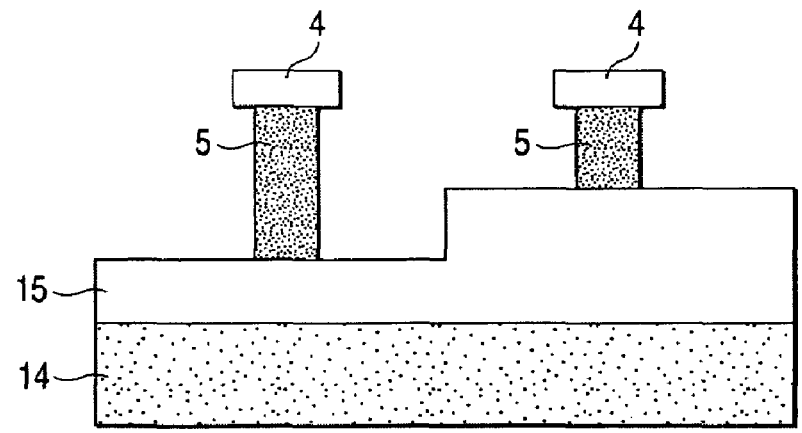

By RIE using the resist films 11 as a mask, the insulating film 4 is selectively etched, thereby forming hard masks each made of the insulating film 4 as shown in FIG. 8H. Next, by crystal anisotropy wet etching or RIE using the insulating films 4 as a mask, the silicon crystal layer 5a is etched. Thus, as shown in FIG. 8I, the silicon fin channels (channel regions 5) having the higher and lower heights are formed. Now it should be noted that the tops of the two channel regions 5 are flush with each other. Where the silicon fin is formed by crystal anisotropy wet etching, with the plane orientation of the silicon layer being (110), the longitudinal direction of the fin must be aligned with <112> direction. The silicon fin formed by this technique serves as an ideal square channel. The channel surface has a (111) orientation, and is smooth or flat in the level of an atomic layer level. On the other hand, where the silicon fin is formed by RIE, the plane orientation of the silicon layer is not limited. However, the silicon fin thus formed generally has a bell shape so that the channel surface will be subjected to damage by plasma.

Figure 8J:
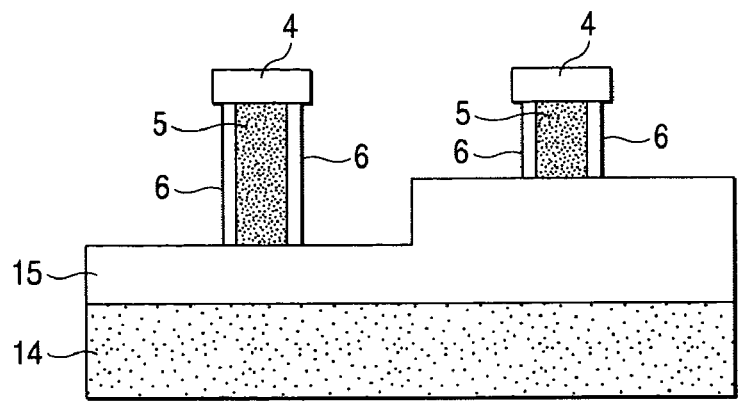
FIGS. 8J to 8L are sectional views of the manufacturing process the sixth embodiment of this invention in order of steps therein (No. 4).
Figure 8K:
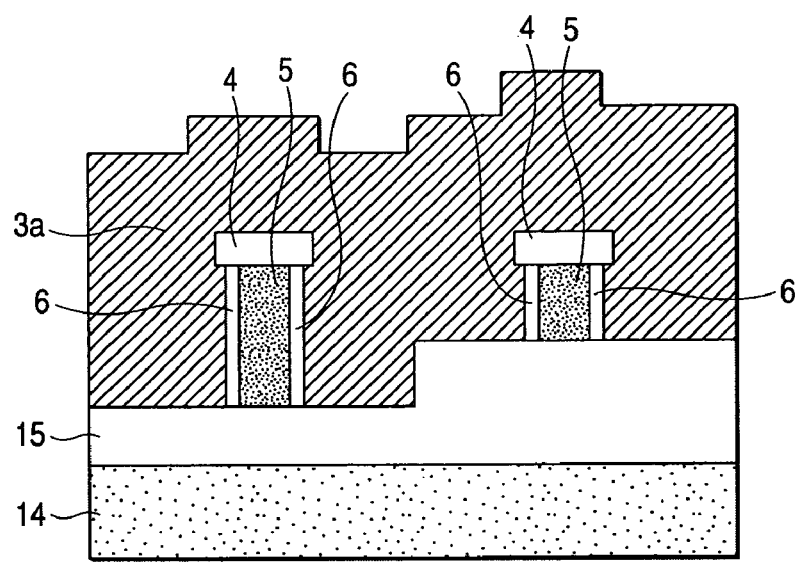
Figure 8L:
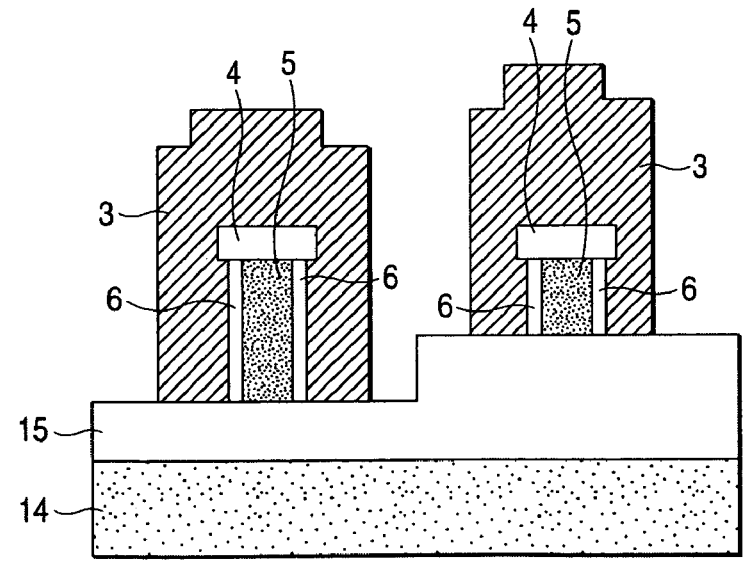

Next, as shown in FIG. 8J, the gate insulating films 6 are formed by thermal oxidation. Further, as shown in FIG. 8K, an electrode material layer 3a is deposited. The electrode material may be a doped polysilicon, or a composite film consisting of a thin refractory metallic film and doped polysilicon which are continuously deposited. Next, as shown in FIG. 8L, gate patterning and gate machining are done by electron beam exposure/development and RIE, thereby forming the gate electrodes 3 for the respective transistors. Finally, doping is done for the extension areas at both ends of the channel through the annealing (RTA) by instantaneous heating. Deposition of the insulating film, forming contact holes, forming Al electrodes and sintering are executed. Thus, the process of manufacturing the semiconductor integrated circuit of the double-gate MOSFETs having silicon fins with different heights and tops located in flush with each other of the silicon fins is completed.

Embodiment 7

Figure 9A:
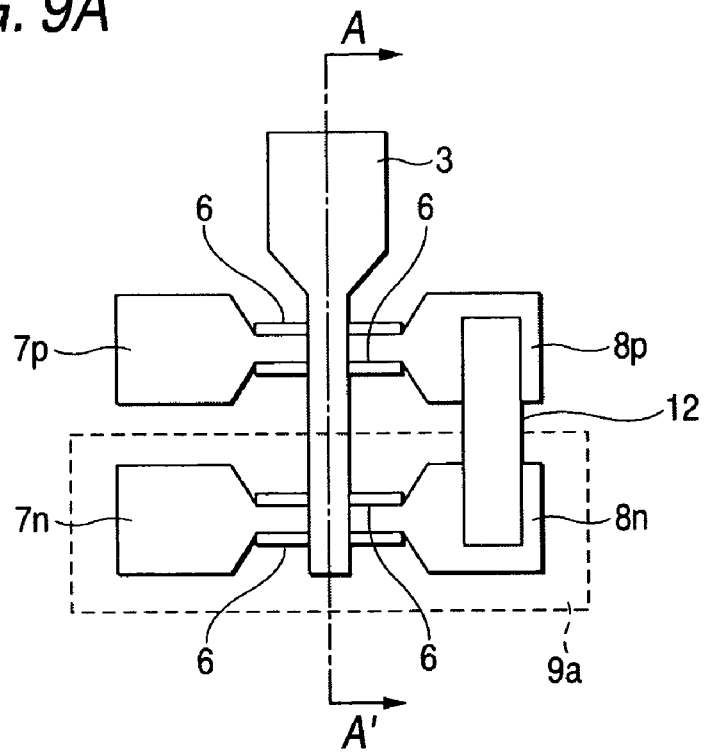
FIGS. 9A and 9B are a plan view and a sectional view showing the seventh embodiment of this invention.
Figure 9B:
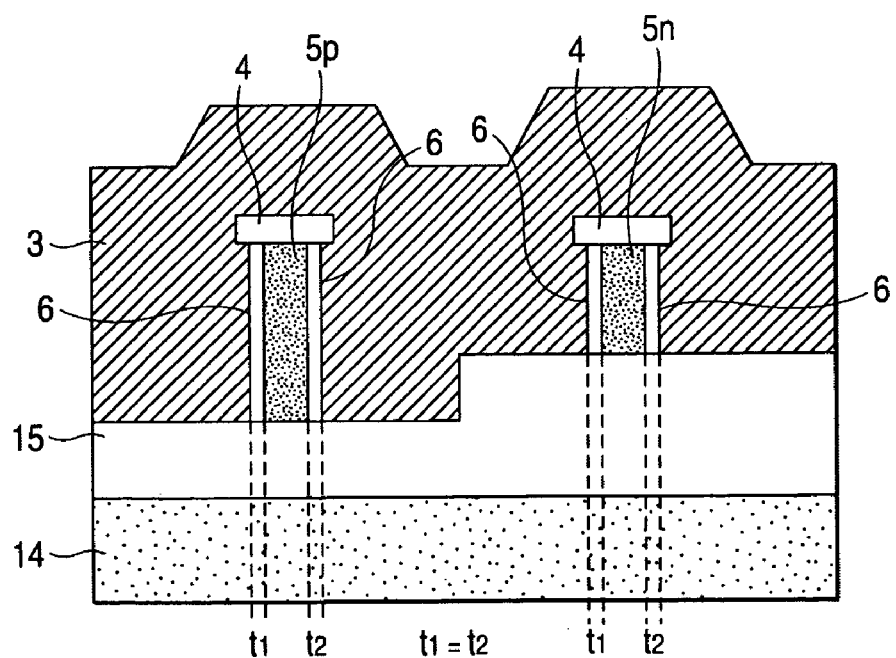

FIG. 9 shows the seventh embodiment of this invention. FIG. 9A is a plan view of a semiconductor integrated circuit having double-gate MOSFETs with the silicon fins formed on an SOI substrate, having different heights and tops located in flush with each other according to this embodiment. FIG. 9B is a sectional view taken in line A-A' in FIG. 9A. In FIG. 9, like reference numerals referring to like elements in the sixth embodiment shown in FIG. 7 will not be explained. In FIG. 9, reference numerals 5p, 7p and 8p denote the channel region, source region and drain region of the pMOS; and reference numerals 5n, 7n and 8n denote the channel region, source region and drain region of the nMOS. In this embodiment, the gate electrode 3 is commonly formed for the pMOS and nMOS, and the drain region 8p of the pMOS and the drain region 8n of the nMOS are connected to each other through a contact metal layer 12.

The manufacturing process in the seventh embodiment is basically the same as that in the sixth embodiment, but is different therefrom in the following three points.

(1) In the doping for the source/drain region as shown in FIG. 8F, the silicon fin channel having a higher height is doped with p-type impurities whereas the silicon fin channel having a lower height is doped with n-type impurities.

(2) In the gate processing as shown in FIG. 8L, the gates for the higher and lower silicon fin channels are connected to each other.

(3) The insulating film (not shown) overlying the transistors is selectively removed to make a contact hole, and the drain region 8p and drain region 8n are connected to each other through the contact metallic layer 12.

Embodiment 8

Figure 10A:
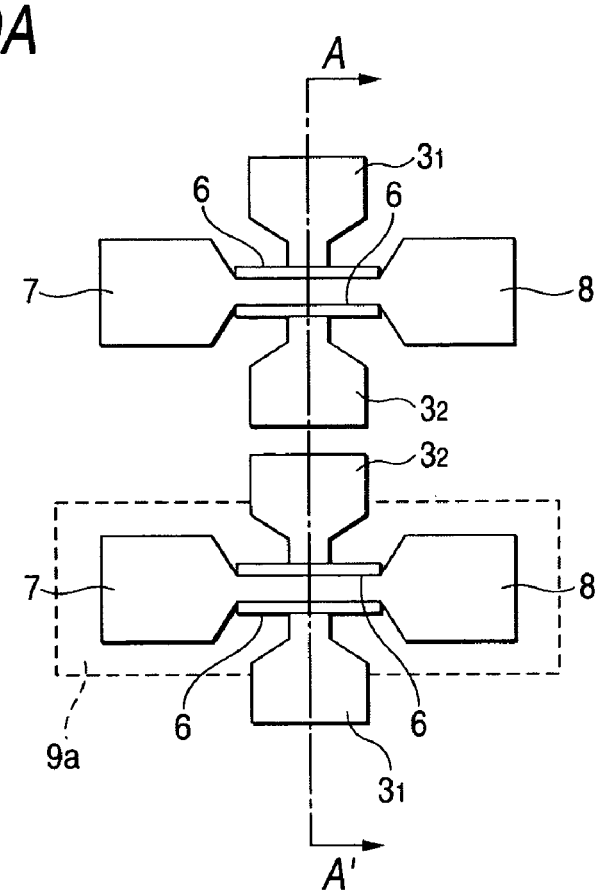
FIGS. 10A and 10B are a plan view and a sectional view showing the eighth embodiment of this invention.
Figure 10B:
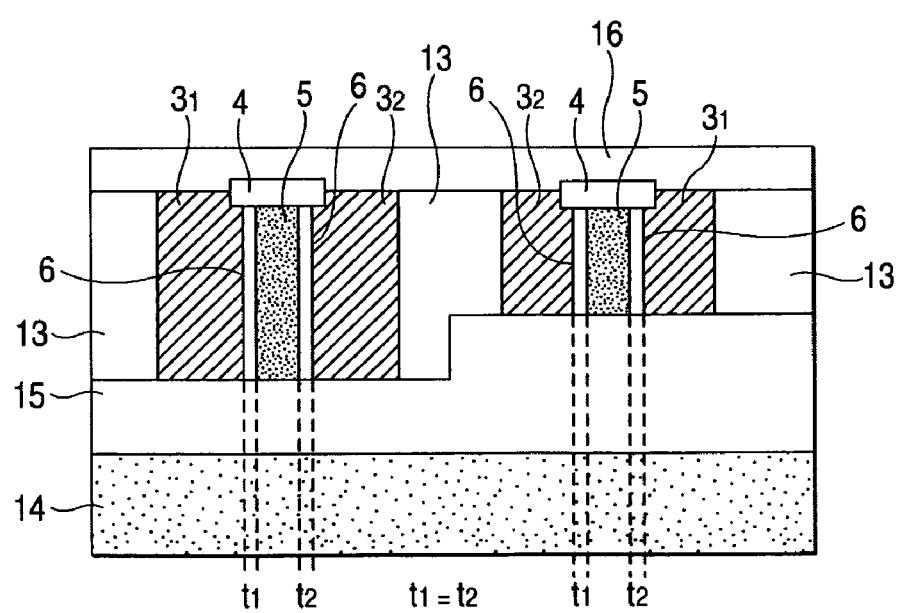

FIG. 10 shows the third embodiment of this invention. FIG. 10A is a plan view of a semiconductor integrated circuit having double-gate MOSFETs with the silicon fins formed on an SOI substrate, having different heights and tops located in flush with each other according to this embodiment. FIG. 10B is a sectional view taken in line A-A' in FIG. 10A. In FIG. 10, like reference numerals referring to like elements in the sixth embodiment shown in FIG. 7 will not be explained. In FIG. 10, reference numeral 31, 32 denotes a gate electrode; 13 denotes a CVD oxide film separating the transistors from each other and 16 a CVD oxide film overlying the transistors. In this embodiment, each of the gate electrodes of both the transistors with a higher fin channel and a lower fin channel is divided into a gate electrode 31 and a gate 32, respectively.

Figure 11A:
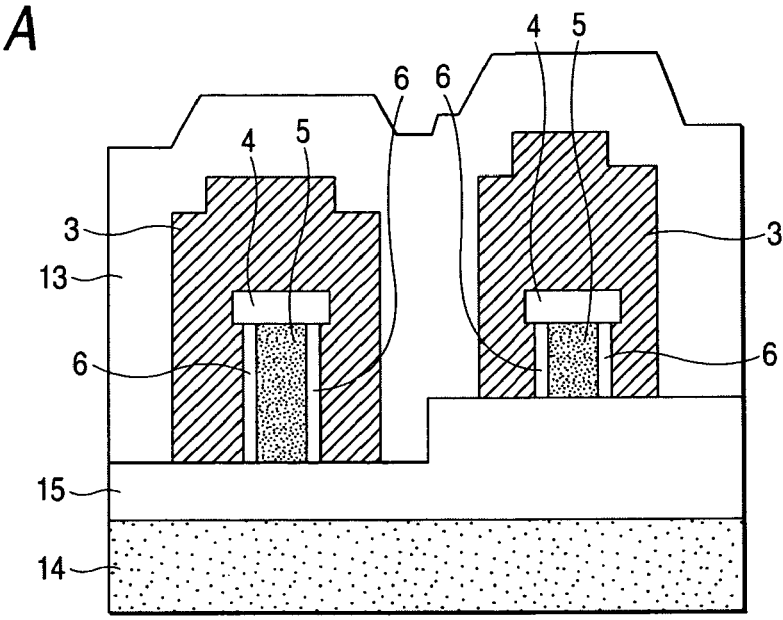
FIGS. 11A to 11C are sectional views of the manufacturing process the eighth embodiment of this invention in order of steps therein.
Figure 11B:
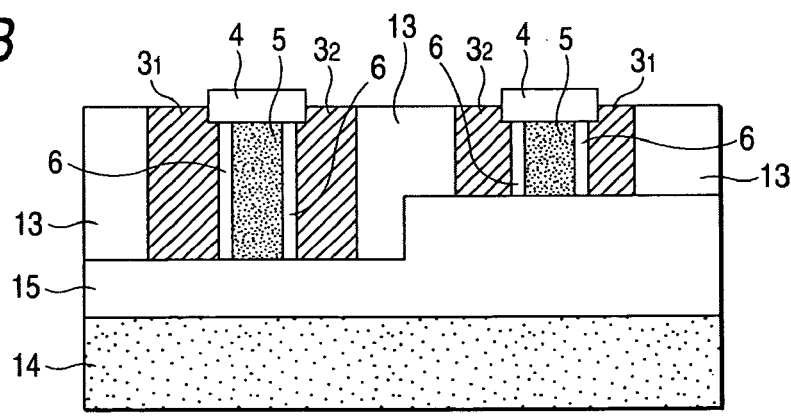
Figure 11C:
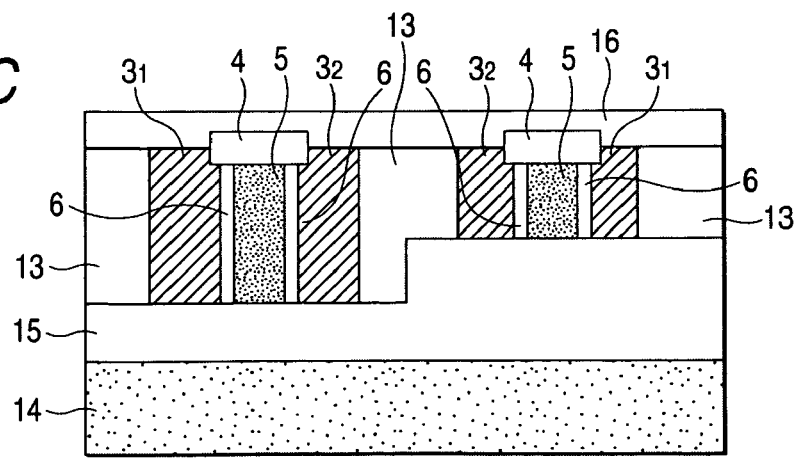

FIGS. 11A to 11C show an exemplary process for manufacturing a semiconductor integrated circuit according to the eighth embodiment of this invention.

The manufacturing process in the eighth embodiment is basically the same as that in the sixth embodiment. The insulating film 4 must be a composite film a thermal oxidation film and nitride film. This is because this insulating film is used as a stopper during CPM.

After steps of gate processing and doping for the extension areas have been completed as shown in FIG. 8L, as shown in FIG. 11A, a CVD oxide film 13 exceeding the height of the gate electrodes is deposited. Next, as shown in FIG. 11B, using CMP, it is polished to the insulating films 4 (stoppers) at the heads of the silicon fin channels. Thus, the gate electrodes each is divided into two gate electrodes. Next, as shown in FIG. 1C, the CVD oxide film 16 is deposited. Further, forming contact holes, forming Al electrodes and sintering are executed. Accordingly, the process of manufacturing a semiconductor integrated circuit having four-terminal double-gate MOSFETs with the silicon fins having different heights and tops located in flush with each other according to this embodiment is completed.

Embodiment 9

Figure 12A:
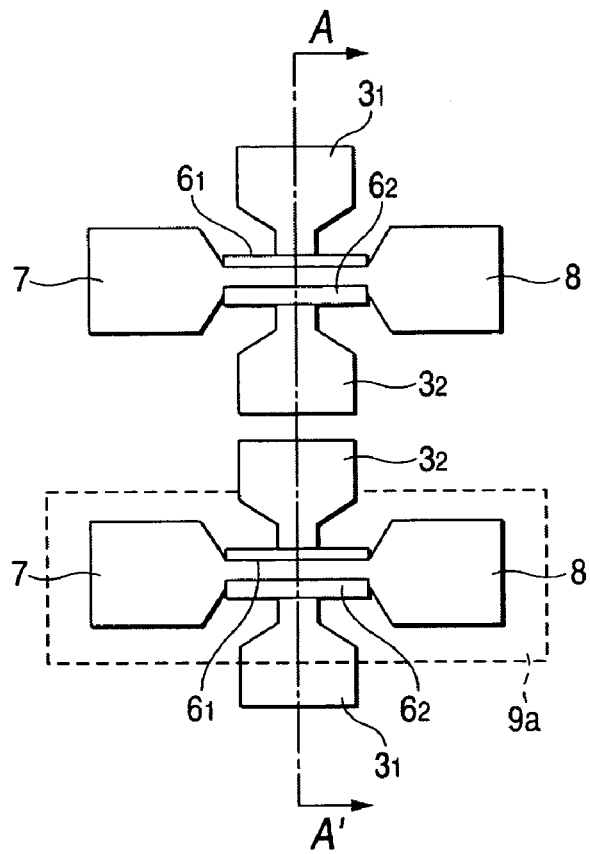
Figure 12A:
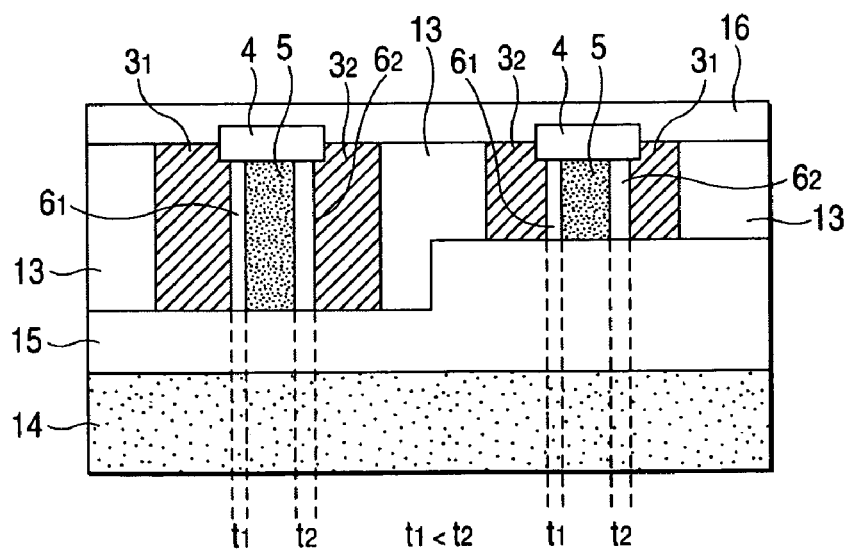

FIG. 12 shows the ninth embodiment of this invention. FIG. 12A is a plan view of a semiconductor integrated circuit having double-gate MOSFETs with the silicon fins formed on an SOI substrate, having different heights and tops located in flush with each other according to this embodiment. FIG. 12B is a sectional view taken in line A-A' in FIG. 12A. In FIG. 12, like reference numerals referring to like elements in the eighth embodiment shown in FIG. 10 will not be explained. In this embodiment, the pair of gate insulating films formed to have different film thicknesses. In FIG. 12, reference numeral 61 denotes the gate insulating film having a larger film thickness and reference 62 denotes the gate insulating film having a smaller film thickness. Namely, assuming that the respective film thicknesses of the gate insulating films are $t_1$ and $t_2$, $t_1<t_2$.

The manufacturing process in the ninth embodiment is basically the same as that in the eighth embodiment, but is different in the following point. Namely, in forming the silicon fins as shown in FIG. 8I, first, the silicon fin side surface on the one side thereof is previously formed and a thicker gate insulating film is formed on this silicon fin side surface. Thereafter, by precise alignment light exposure, the silicon fin side on the other side is formed, and a thinner gate insulating film is formed on this silicon fin side. The remaining steps are the same as those in the eighth embodiment.

In accordance with the sixth to ninth embodiments of this invention, the separated-gate four-terminal fin type MOSFETs each with the gate electrodes electrically connected to each other and electrically insulated from each other, which are manufactured through techniques of substrate bonding and CMP, can take a very advantageous structure for multi-wiring since the tops of their silicon fins are flush with other.

By using the separated-gate four-terminal fin type MOSFETs with the gates electrode electrically insulated from each other according to this invention, the threshold voltage can be easily controlled. In the conventional control of the threshold voltage, the threshold voltage is controlled by doping for the channels through ion implantation, but variation in the impurity concentration has become problematic with miniaturization of channel size. These problems can be solved by Embodiments 3, 4, 5, 8 and 9 of this invention.

Embodiment 10

Figure 13:
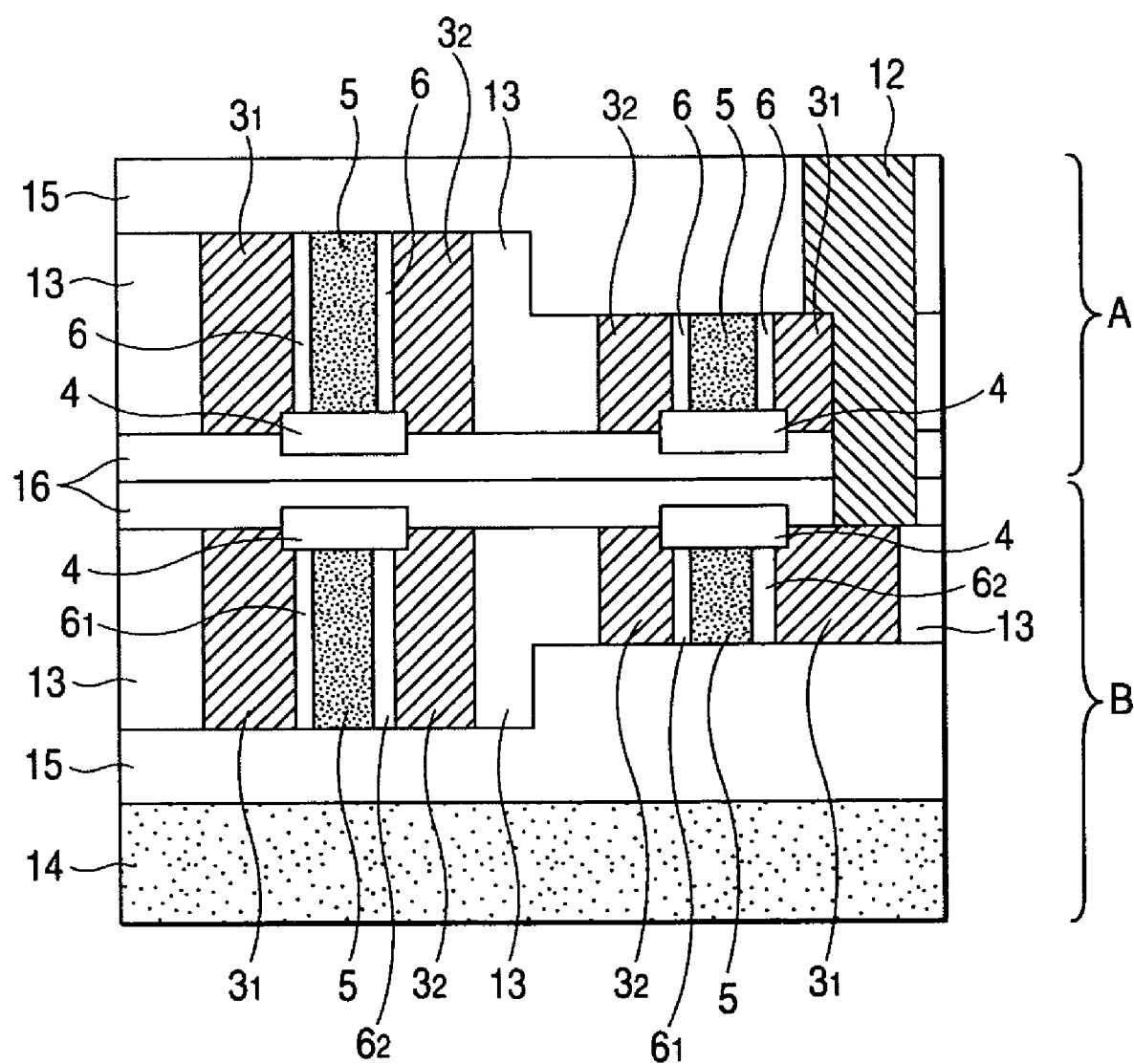
FIG. 13 is a sectional view showing the tenth embodiment of this invention.
Figure 14A:
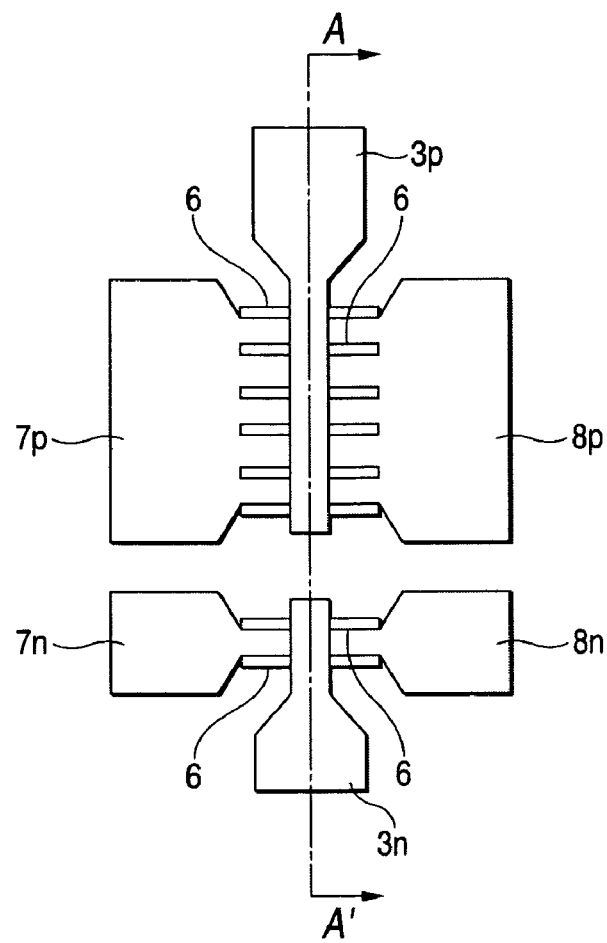
FIGS. 14A and 14B are a plan view and a sectional view showing the first prior art.
Figure 14B:
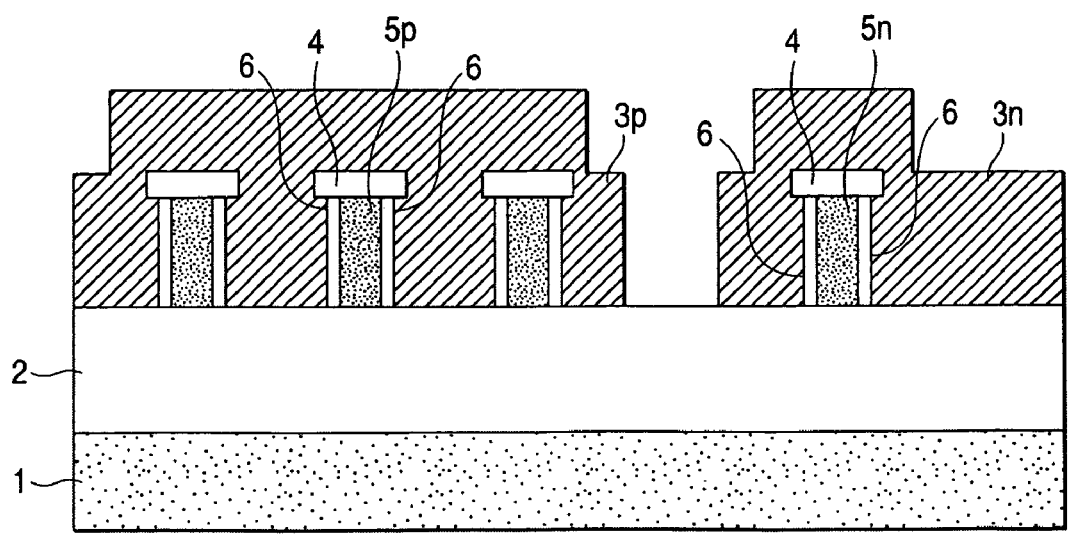
Figure 15A:
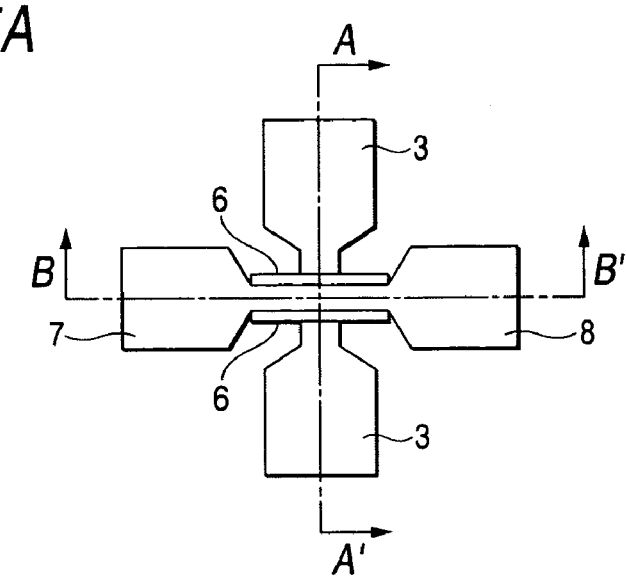
FIGS. 15A to 15C are plan view and a sectional view showing the second prior art.
Figure 15B:
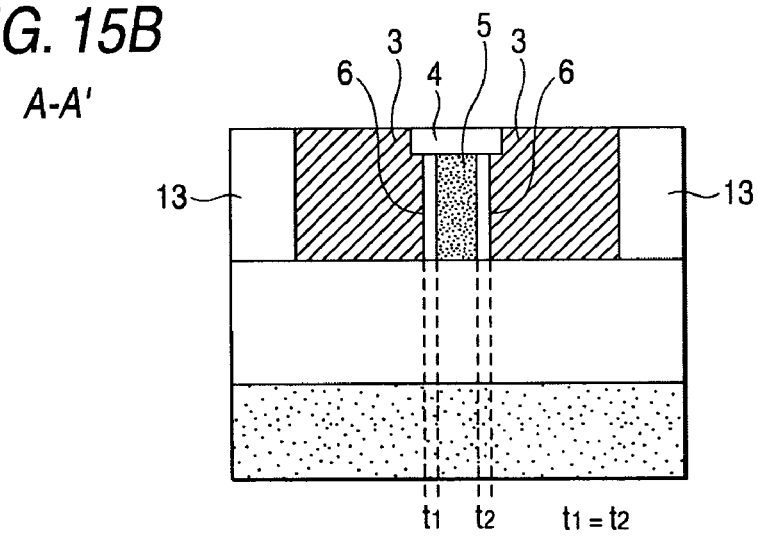
Figure 15C:
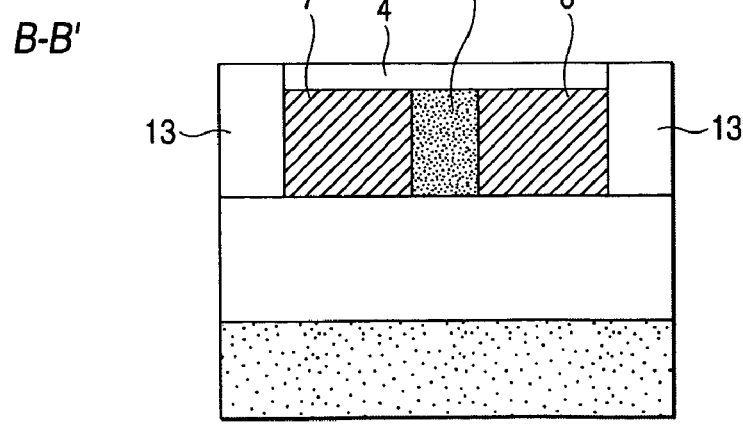
Figure 16A:
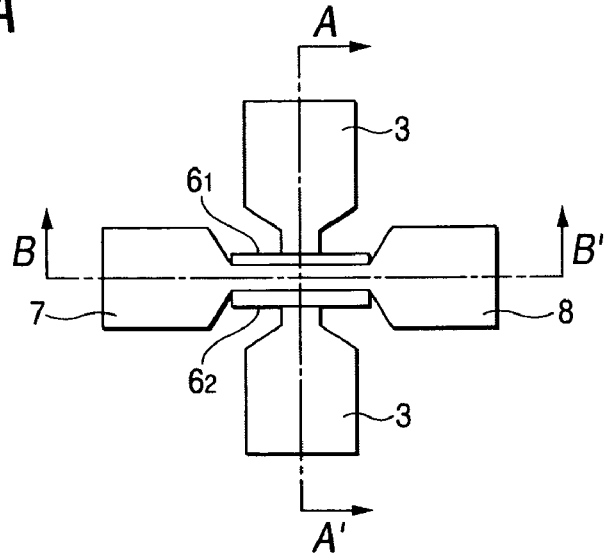
FIGS. 16A to 16C are plan view and a sectional view showing the third prior art.
Figure 16B:
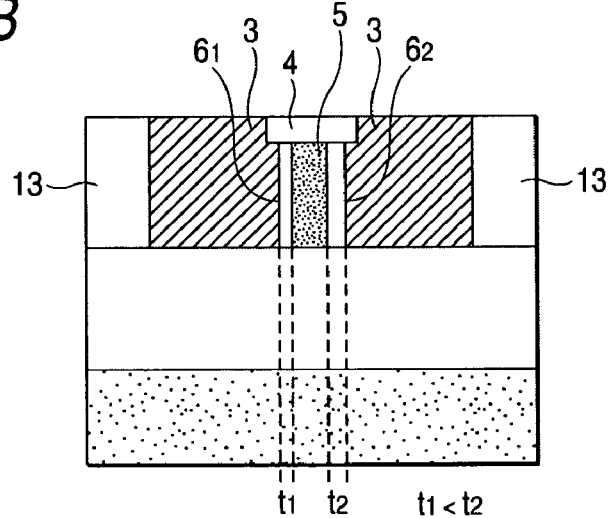
Figure 16C:
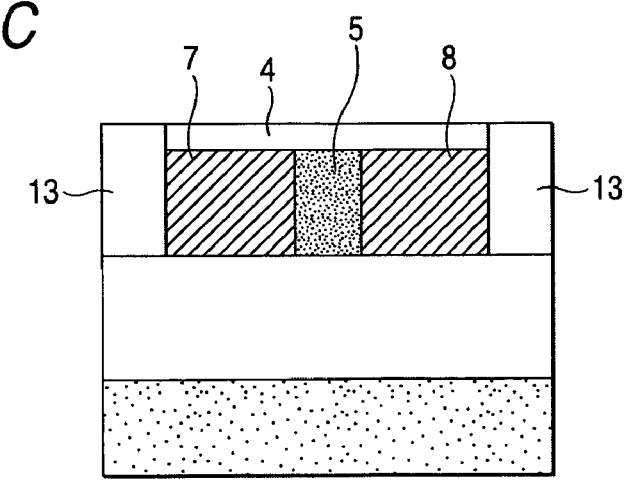

FIG. 13 is a sectional view of the tenth embodiment of this invention. This embodiment can be realized by bonding the semiconductor integrated circuits (in FIG. 13, A corresponds to the eighth embodiment whereas B corresponds to the ninth embodiment) according to the eighth embodiment and the ninth embodiment, removing the one supporting substrate by "lost wafer technique", making the contact holes in the oxide films and connecting the upper and lower semiconductor integrated circuits through the contact layer 12. Thus, a multi-layer structure with multi-function and high density can be manufactured. In FIG. 13, like reference numerals refer to like elements in FIGS. 10 and 12.

Here, exemplified is the multi-layer structure by bonding the semiconductor integrated circuit substrates each having the four-terminal double-gate MOSFETs with different heights of the silicon fin channels, and symmetrical gate insulating film thicknesses (A) and asymmetrical gate insulating film thicknesses (B). However, in addition to such an example, if the CVD oxide films deposited on the integrated circuit substrates manufactured according to the other embodiments are flattened by CMP, they can be bonded to each other. Thus, the multi-layer structure with the multi-function and high density can be manufactured.

In accordance with this invention, transistors with different current capacities can be formed to have the same area. Therefore, in accordance with this invention, a sophisticated semiconductor integrated circuit can be realized with high density. Further, if a CMOS inverter is formed to have a pMOS channel as a higher height lateral channel and an nMOS channel as a lower height lateral channel, the CMOS inverter with accurate current matching can be constituted within a small area. Further, since the manufacturing method according to this invention is implemented by only the process usually adopted, the semiconductor integrated circuit with high integration and density can be realized at a low cost.

What is claimed is:

1. A semiconductor integrated circuit comprising:
    a plurality of double-gate MOSFETs formed on the same substrate,
    each of the MOSFETs including:
    an upstanding thin-film lateral channel region of semiconductor;
    a source region and a drain region which are formed adjacently to the lateral ends of the upstanding thin film lateral channel region;
    gate insulating films and gate electrodes formed on both sides of the upstanding thin film lateral channel region, wherein
    the semiconductor integrated circuit includes two double-gate MOSFETs with the upstanding lateral channel regions having different heights,
    a pair of gate electrodes of the transistor with the upstanding thin film lateral channel region with a higher height are electrically independent from each other, and
    a pair of gate electrodes of the transistor with the upstanding thin film lateral channel region with a lower height are electrically connected to each other.

2. The semiconductor integrated circuit according to claim 1, wherein
the transistor with the upstanding thin film lateral channel region with a higher height is a p-channel MOSFET, and
the transistor with the upstanding thin film lateral channel region with a lower height is a n-channel MOSFET.

3. The semiconductor integrated circuit according to claim 1, wherein
tops of the upstanding thin film channel regions having different heights are flush with each other.

4. The semiconductor integrated circuit according to claim 1, wherein
a pair of gate electrodes of each of the double-gate MOSFETs are independent from each other.

5. The semiconductor integrated circuit according to claim 1, wherein
a pair of gate insulating films of each of the double-gate MOSFETs have different film thicknesses.

6. The semiconductor integrated circuit according to claim 1, wherein
the upstanding thin film lateral channel region, the source region and the drain region are made of crystalline silicon.

7. The semiconductor integrated circuit according to claim 1, wherein
the upstanding thin film lateral channel region, the source region and the drain region are made of a silicon layer of an S01 substrate.

8. The semiconductor integrated circuit according to claim 6, wherein
a plane tangent to the gate insulating films of the upstanding thin film lateral channel region has a (111) orientation.

9. The semiconductor integrated circuit according to claim 7, wherein
a plane tangent to the gate insulating films of the upstanding thin film lateral channel region has a (111) orientation.

10. The semiconductor integrated circuit constituting a multi-layer by superposing the semiconductor integrated circuits according to claim 1.

11. A semiconductor integrated circuit comprising:
a plurality of double-gate MOSFETs formed on the same substrate,
each of the MOSFETs including:
an upstanding thin-film lateral channel region of semiconductor;
a source region and a drain region which are formed adjacently to the lateral ends of the upstanding thin film lateral channel region;
gate insulating films and gate electrodes formed on both sides of the upstanding thin film lateral channel region, wherein
the semiconductor integrated circuit includes two double-gate MOSFETs with the upstanding lateral channel regions having different heights, and
a pair of gate electrodes of the transistor with the upstanding thin film lateral channel region with a higher height are electrically independent from each other.

12. A semiconductor integrated circuit comprising:
a plurality of double-gate MOSFETs formed on the same substrate,
each of the MOSFETs including:
an upstanding thin-film lateral channel region of semiconductor;
a source region and a drain region which are formed adjacently to the lateral ends of the upstanding thin film lateral channel region;
gate insulating films and gate electrodes formed on both sides of the upstanding thin film lateral channel region, wherein
the semiconductor integrated circuit includes two double-gate MOSFETs with the upstanding lateral channel regions having different heights, and
a pair of gate electrodes of the transistor with the upstanding thin film lateral channel region with a lower height are electrically connected to each other.

* * * * *